US012805297B2

(12) United States Patent
Lin et al.

(10) Patent No.: US 12,805,297 B2
(45) Date of Patent: Nov. 17, 2026

(54) SEMICONDUCTOR DEVICE STRUCTURES AND METHODS OF MANUFACTURE

(71) Applicant: TAIWAN SEMICONDUCTOR MANUFACTURING COMPANY, LTD., Hsinchu (TW)

(72) Inventors: Yi-Ming Lin, Hsinchu (TW); Jhen-Wei Chen, Hsinchu (TW); Ling-Sung Wang, Hsinchu (TW); Yu-Jen Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 541 days.

(21) Appl. No.: 18/317,462

(22) Filed: May 15, 2023

(65) Prior Publication Data

US 2024/0387366 A1 Nov. 21, 2024

(51) Int. Cl.

| | |
|---|---|
| ***H01L 23/528*** | (2006.01) |
| ***H10W 10/00*** | (2026.01) |
| ***H10W 10/10*** | (2026.01) |
| ***H10W 20/00*** | (2026.01) |
| ***H10W 20/43*** | (2026.01) |

(52) U.S. Cl.

CPC .......... *H10W 20/43* (2026.01); *H10W 10/011* (2026.01); *H10W 10/10* (2026.01); *H10W 20/056* (2026.01)

(58) Field of Classification Search

CPC ................. H01L 23/528; H01L 21/762; H01L 21/76877; H10W 20/43; H10W 10/011; H10W 10/10; H10W 20/056

See application file for complete search history.

(56) References Cited

U.S. PATENT DOCUMENTS

| | | | | |
|---|---|---|---|---|
| 6,984,563 | B1 * | 1/2006 | Higgins, Sr. | H10B 69/00 438/257 |
| 12,057,449 | B2 * | 8/2024 | Chen | H10D 84/0151 |
| 2012/0313214 | A1 * | 12/2012 | Yeh | H10W 10/0145 257/E21.546 |
| 2020/0033657 | A1 * | 1/2020 | Chen | G02F 1/13454 |
| 2021/0242331 | A1 * | 8/2021 | You | H10D 30/014 |
| 2022/0173211 | A1 * | 6/2022 | Cucci | H10D 62/115 |
| 2023/0112377 | A1 * | 4/2023 | Shanbhag | H10D 86/01 257/66 |
| 2023/0343640 | A1 * | 10/2023 | Su | H10W 20/056 |
| 2023/0378183 | A1 * | 11/2023 | Stamper | H10D 30/0221 |

FOREIGN PATENT DOCUMENTS

| | | |
|---|---|---|
| TW | 202224099 | 6/2022 |
| TW | 202316529 | 4/2023 |

* cited by examiner

*Primary Examiner* — Thao P Le
(74) *Attorney, Agent, or Firm* — Hauptman Ham, LLP

(57) ABSTRACT

Disclosed are methods of manufacturing semiconductor devices that include the operations of forming an isolation structure in a semiconductor substrate, forming an active region adjacent the isolation structure, forming at least two primary polysilicon structures over the active region, the primary polysilicon structures defining a contacted polysilicon pitch (CPP), and forming a secondary polysilicon structure over the isolation structure. In some methods, the secondary polysilicon structure is further modified and/or replaced in order to provide additional functional elements on the semiconductor devices.

20 Claims, 29 Drawing Sheets

100N

300D

300E

300F

600A

600C

600D

SEMICONDUCTOR DEVICE STRUCTURES AND METHODS OF MANUFACTURE

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers of material over a substrate, and patterning the various material layers using lithography to form circuit components and elements thereon. As the semiconductor industry has progressed into nanometer technology process nodes in pursuit of higher device density, higher performance, and lower costs, challenges from both fabrication and design issues have resulted in the development of a number of three-dimensional designs including, for example, Metal-Oxide-Silicon Field Effect Transistors (MOS-FET), Field Effect Transistors (FET), Fin Field Effect Transistor (Fin-FET), Nano-Sheet Field Effect Transistor, Nano-Wire Field Effect Transistor, and Gate-All-Around (GAA) devices.

Integrated circuit (IC) manufacturing is typically divided into front-end-of-line (FEOL) processing and back-end-of-line (BEOL) processing. FEOL processes generally encompass those processes related to fabricating functional elements, such as transistors and resistors, in or on a semiconductor substrate. For example, FEOL processes typically include forming isolation features, gate structures, and source and drain features (also referred to as source/drain, S/D, or SD features). BEOL processes generally encompass those processes related to fabricating a multilayer interconnect (MLI) feature that interconnects the functional IC elements and structures fabricated during FEOL processing to provide connection to and enable operation of the resulting IC devices. Process and structural modifications that reduce the process complexity and/or size of features associated with, for example, gate structures and multilayer interconnect structures, tend to reduce the overall size of the IC devices, improve cycle time, and/or improve yield and reliability.

BRIEF DESCRIPTION OF THE DRAWINGS

Aspects of the present disclosure are better understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
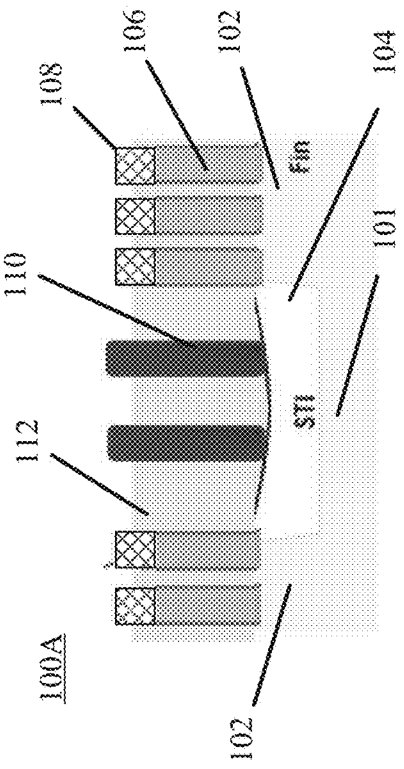
FIGS. 1A, 1C, 1E, 1G, 1I, 1K, and 1M-1Q are cross-sectional views of a semiconductor device during various operations of a semiconductor device manufacturing process, according to some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first are formed in direct contact the second features and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath." "below." "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The structures and methods detailed below relate generally to the structures, designs, and manufacturing methods for IC devices include a series of active areas or active regions separated by isolation structure(s), e.g., shallow trench isolation (STI) structures, in which one or more supplemental structures are provided above the isolation structure(s) for improving the manufacturing operations by, e.g., improving uniformity in structures in the active regions and/or providing additional functional elements and thereby improving the utilization of the semiconductor device surface area and providing a desired functionality. Although the structures and methods will be discussed in terms of fin field effect transistor (FIN FET) devices, the structures and methods are not so limited and are suitable for inclusion in manufacturing processes for other classes and configurations of IC devices including, without limitation, bulk semiconductor devices and silicon-on-insulator (SOI) devices, Metal-Oxide-Silicon Field Effect Transistors (MOSFET or simply FET), Fin Field Effect Transistor (FinFET), Nano-Sheet Field Effect Transistor, Nano-Wire Field Effect Transistor, Gate-All-Around (GAA) devices, gate first devices, gate last devices, high-K Metal Gate (HKMG) devices, planar devices, and Back End of Line (BEOL) devices.

As feature areas continue to shrink, the physical alignment and sizing of successive layers and elements and maintaining the electrical isolation of separate elements represents significant challenges. In some embodiments, the relocation and/or resizing of one or more features provides spacing sufficient for the inclusion of additional conductive features, e.g., vias, power rails, resistors, and heat sinks that, in turn, reduces the need for additional conductive elements in one or more of the associated conductive patterns and/or can increase device density. In some embodiments, the formation of functional elements over the isolation structures preserves the active regions for predetermined circuitry and/or reduces the height of the IC device by providing the functional elements in a configuration corresponding to, for example, the height of the gate structures. In some embodiments, modifying the compositions used in forming certain features provides increased etch selectivity and increases the likelihood that the complete removal of residual material from even high-aspect ratio features can be achieved without undue overetching or non-uniformity.

FIG. 1A is a cross-sectional view of an IC device 100A at an operation used in the manufacture of IC devices according to some embodiments. The IC device 100A in FIG. 1A includes a semiconductor substrate 101 having active regions 102 which are separated by an isolation structure(s) 104 (or an isolation region). In some embodiments, the isolation structure is formed using two or more dielectric materials. In some embodiments, the semiconductor substrate 101 is patterned and etched to form recessed regions (not shown) into which the dielectric material(s) is/are deposited or grown to form isolation structure(s) 104. In some embodiments, the isolation structure(s) 104 are selected from Shallow Trench Isolation (STI) structures, Local Oxidation of Silicon (LOCOS) structures, Deep Trench Isolation (DTI) structures, trench isolation, p-n junction isolation (PN)/p-i-n isolation (PIN) structure. In some embodiments, the isolation structure(s) 104 are formed using materials having a high dielectric constant (k value), e.g., K>3.9. In some embodiments, the high-k dielectric material includes one or more of $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr) $TiO_3$ (BST), $Al_2O_3$, $Si_3N_4$, $SiO_xN_y$, and combinations thereof, or another suitable material. The insulating/dielectric materials of the isolation structure(s) 104 may be formed by atomic layer deposition (ALD), physical vapor deposition (PVD), chemical vapor deposition CVD, plasma enhanced chemical vapor deposition (PECVD), thermal oxidation, self-aligned monolayer (SAM) deposition and/or one or more other suitable method(s).

The IC device 100A in FIG. 1A includes a series of primary polysilicon structures 106 over the active regions 102 that, in some embodiments have been etched from a first polysilicon layer (not shown) by removing the portions of the first polysilicon layer that are not covered by a hard mask pattern 108. In some embodiments, the primary polysilicon structures 106 are arranged over (or, in some embodiments, directly on) the active regions 102 with a spacing referred to as the contacted polysilicon pitch (CPP), a distance that is determined by the design rules applicable to the particular manufacturing method being used to manufacture the IC device.

The IC device 100A in FIG. 1A also includes one or more secondary polysilicon structures 110 formed over the isolation structure(s) 104. In some embodiments, the primary polysilicon structures 106 and the secondary polysilicon structures 110 are both formed from the first polysilicon layer during the etch operation. In some embodiments, the secondary polysilicon structures 110 are formed after the primary polysilicon structures 106 by growing or depositing polysilicon on predetermined portions of the upper surface of the isolation structure(s) 104 exposed by a photoresist pattern 112. The number and spacing of the secondary polysilicon structures 110 that are utilized in a particular semiconductor device layout is, at least in part, a function of the number and width of the open space above the isolation structure(s) 104. In some embodiments, if the width of the open space between two active regions 102 is greater than 1.5 times the applicable CPP, there is space for the placement of one or more secondary polysilicon structures 110 above the isolation structure(s) 104.

Figure 1B:
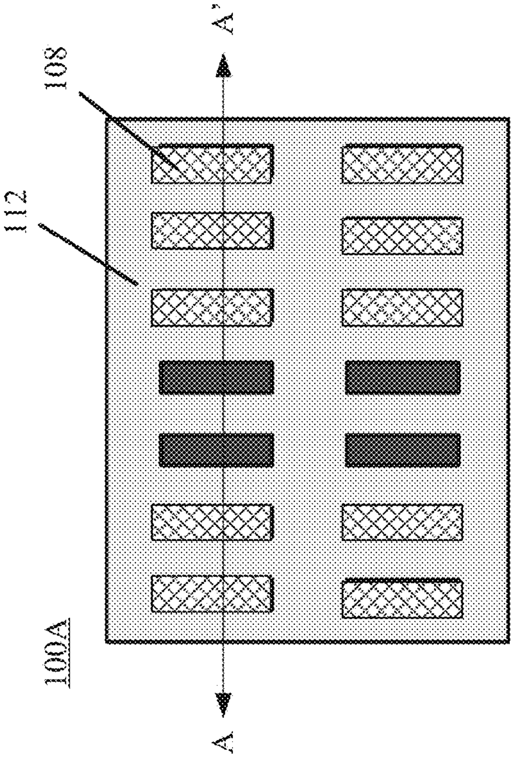
FIGS. 1B, 1D, 1F, 1H, 1J, and 1L, are plan views of a semiconductor device during various operations of a semiconductor device manufacturing process corresponding to FIGS. 1A, 1C, 1E, 1G, 1I, and 1K, according to some embodiments.

The IC device 100A in FIG. 1B is a plan view of the structure in the cross-sectional view of FIG. 1A (taken along plane A-A' of FIG. 1B) showing the upper surfaces of the hard mask pattern 108, the secondary polysilicon structures 110, and the photoresist pattern 112.

Figure 1C:
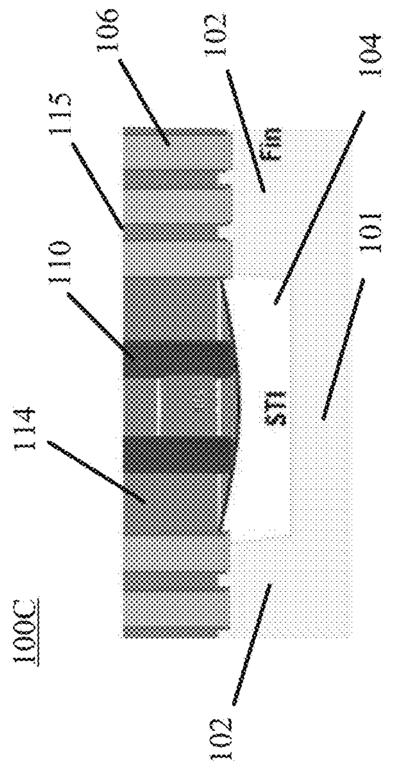

The IC device 100C in FIG. 1C is a cross-sectional view of an IC device at an operation subsequent to the operation of FIG. 1A according to some embodiments. The IC device 100C in FIG. 1C has been processed through a clean-up operation to remove the photoresist pattern 112 and a deposition operation to fill the spaces left by the removal of the photoresist pattern 112 with an interlayer dielectric (ILD) layer (not shown). A planarization process is then applied to remove the hard mask pattern 108 and the upper portions of the first interlayer dielectric layer (not shown), the secondary polysilicon structures 110, and the primary polysilicon structures 106 to form a planar surface 115.

In some embodiments, the addition of the secondary polysilicon structures 110, by improving the uniformity of the polysilicon density across the surface of the wafer, improves the uniformity of subsequent processing operations including, for example, etches and/or planarization operations. In some embodiments, this improved uniformity will be evident in the post-processing examination of those structures in the active regions that are adjacent the isolation structures. The improved uniformity achieved across the surface of the wafer will tend to be reflected in both improved processing yield and increased performance and/or reliability of the resulting semiconductor devices.

In some embodiments the planarization process utilizes a chemical-mechanical polishing (CMP) process or an etch-back process, to provide a more planar surface for subsequent processing. CMP processes utilize the action of a polishing pad in combination with an abrasive slurry that are applied to a surface of an IC device using a polishing machine for removing upper portions of different material layers. In some embodiments, the particular combination of the CMP polishing pad and slurry are selected based on factors including the material(s) being removed, e.g., silicon dioxide, polysilicon, or single crystal silicon, the technical performance requirement(s), process optimization, and/or cost-of-ownership considerations. In an etchback process, an IC device surface is exposed to one or more dry etch processes to remove a portion of an upper layer of material and thereby improve the planarity of the IC device surface. In some embodiments, the etchant gases used in the etchback process include a combination of $CF_4$, $CHF_3$, Ar, and $O_2$ and are applied under varying levels of gas flow and RF power depending on the material(s) being etched and the stage of the etchback process.

Figure 1D:
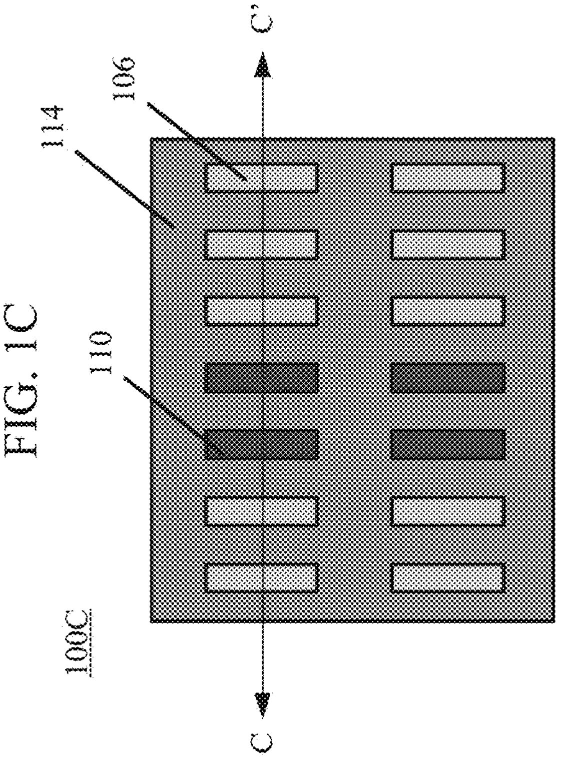

The IC device 100C in FIG. 1D is a plan view of the structure in the cross-sectional view of FIG. 1C (taken along plane C-C' of FIG. 1D) showing the upper surfaces of the planar surface 115.

Figure 1G:
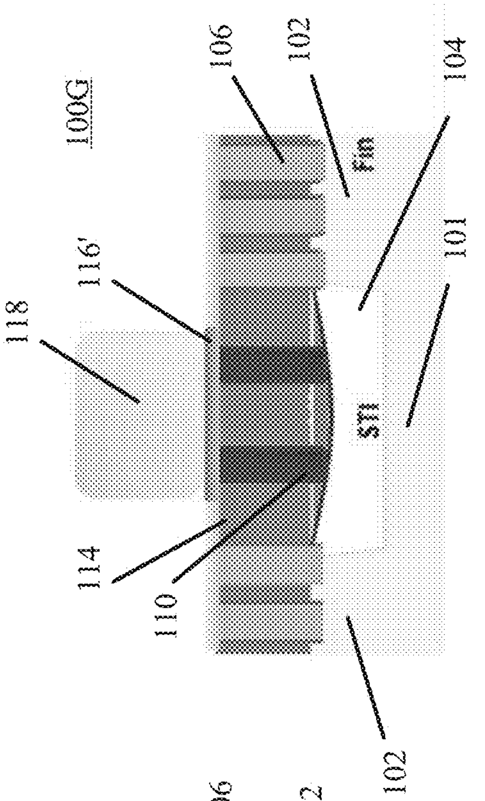
Figure 1H:
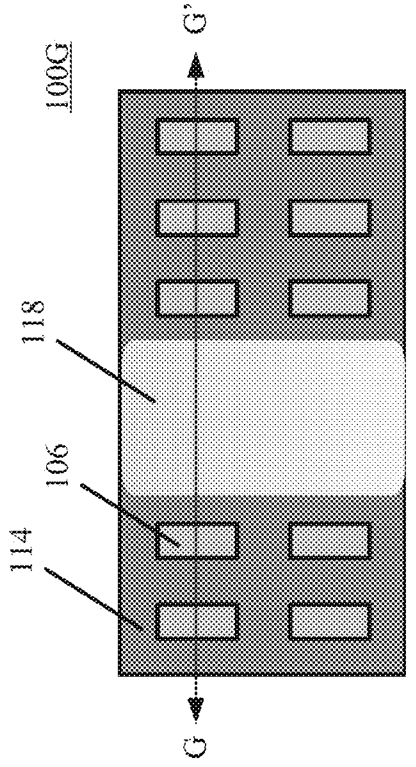
Figure 1E:
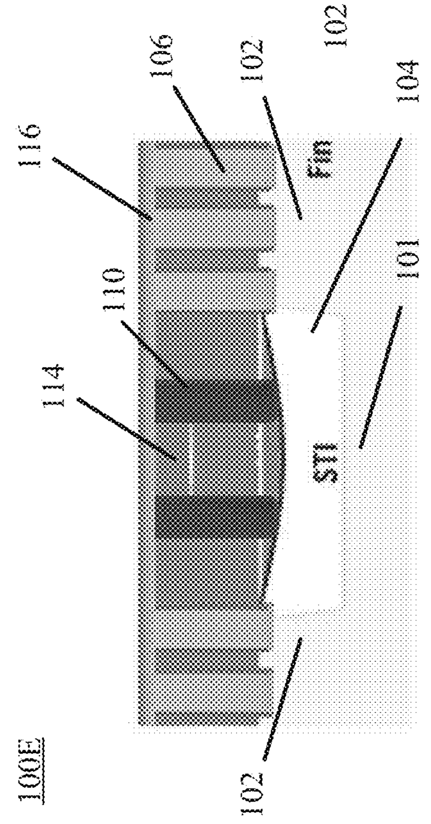

The IC device 100E in FIG. 1E is a cross-sectional view of an IC device as a result of an operation subsequent to the operation of FIG. 1C according to some embodiments. The IC device 100E in FIG. 1E has been processed utilizing a deposition operation to apply a contact etch stop layer 116 (CESL) to the planar surface 115.

Figure 1F:
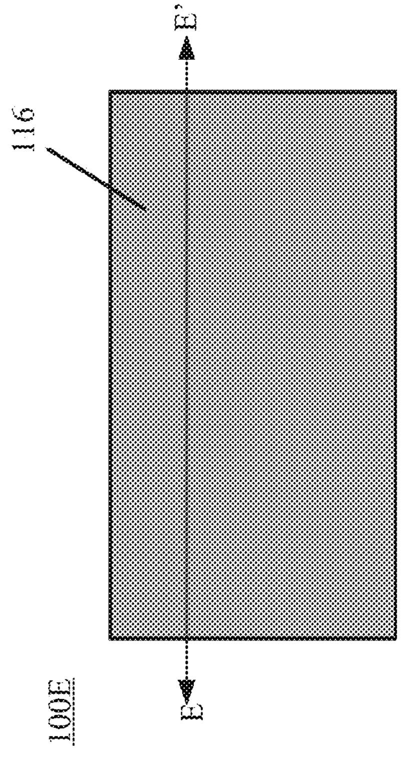

The IC device 100E in FIG. 1F is a plan view of the structure in the cross-sectional view of FIG. 1E (taken along plane E-E' of FIG. 1F) showing the upper surface of the contact etch stop layer 116.

The IC device 100G in FIG. 1G is a cross-sectional view of an IC device at an operation subsequent to the operation of FIG. 1E according to some embodiments. The IC device 100G in FIG. 1G has been processed utilizing both a patterning operation and an etch operation. The patterning operation exposes and develops a photoresist layer (not shown) with the residual portions of the photoresist layer forming a photoresist pattern 118 that serves as an etch mask for removing the exposed portions of the contact etch stop layer 116 and leaving a residual portion of the contact etch stop layer 116' to protect the secondary polysilicon structures 110 (sometimes referred to as "dummy" polysilicon) while simultaneously exposing the upper surfaces of the primary polysilicon structures 106 and the residual dielectric regions 114 surrounding the primary polysilicon structures 106.

The IC device 100G in FIG. 1H is a plan view of the structure in the cross-sectional view of FIG. 1G (taken along plane G-G' of FIG. 1H) showing the upper surfaces of the photoresist pattern 118, the primary polysilicon structures 106 and the residual dielectric regions 114 surrounding the primary polysilicon structures.

Figure 1I:
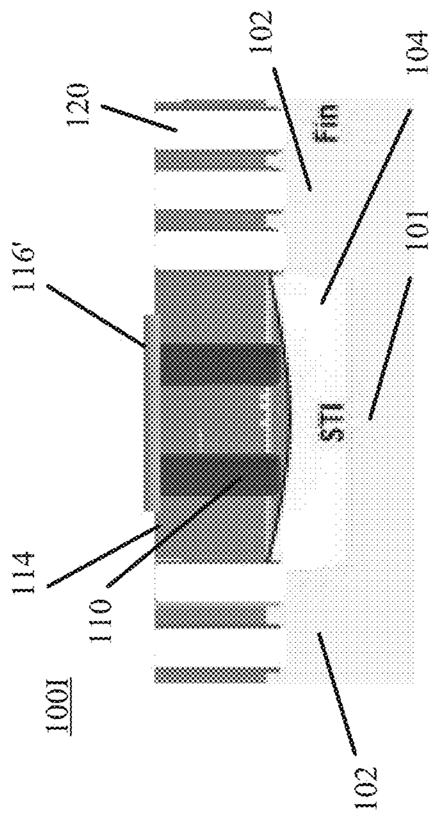

The IC device 1001 in FIG. 1I is a cross-sectional view of an IC device at an operation subsequent to the operation of FIG. 1G according to some embodiments. The IC device 1001 in FIG. 1I has been processed utilizing a cleanup operation to remove the photoresist pattern 118 and an etch operation to remove the primary polysilicon structures 106, thereby forming a series of primary contact openings 120 corresponding to the positions of the primary polysilicon structures 106.

Figure 1J:
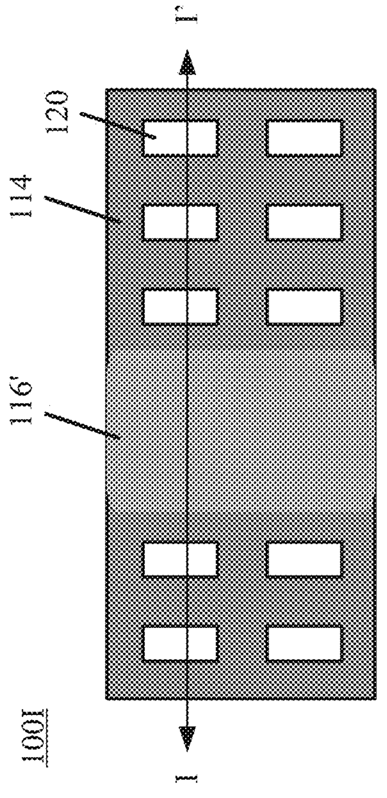

The IC device 1001 in FIG. 1J is a plan view of the structure in the cross-sectional view of FIG. 1I (taken along plane I-I' of FIG. 1J) showing the upper surfaces of the residual portion of the contact etch stop layer 116', the primary contact openings 120 formed by removing the primary polysilicon structures 106 and the residual dielectric regions 114 surrounding the primary contact openings 120.

In some embodiments, the etch process is performed using plasma etching, reactive ion etching (RIE), or a liquid chemical etch solution. In some embodiments a liquid chemical etch solution including one or more etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof is used to remove the primary polysilicon structures 106.

In some embodiments, the etching process uses a dry-etch or plasma etch process performed using halogen-containing reactive gases excited by an electromagnetic field to dissociate into ions that are then accelerated toward the material being etched and used to remove a target material or materials including, for example, the primary polysilicon structures 106. Reactive or etchant gases include, for example, $CF_4$, $SF_6$, $NF_3$, $Cl_2$, $CCl_2F_2$, $SiCl_4$, $BCl_2$, and combinations thereof, although other semiconductor-material etchant gases are also envisioned within the scope of the present disclosure.

Figure 1K:
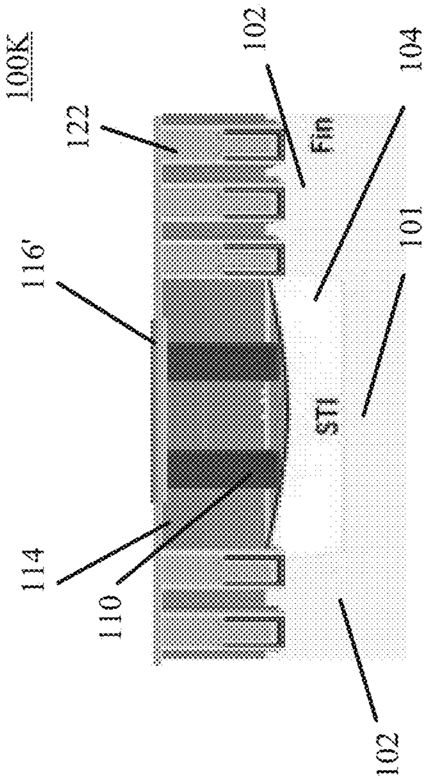

The IC device 100K in FIG. 1K is a cross-sectional view of an IC device at an operation subsequent to the operation of FIG. 1I according to some embodiments. The IC device 100K in FIG. 1K has been processed utilizing a series of deposition operations, growth operations, and/or planarization operations to fill the primary contact openings 120 with conductive material(s). In some embodiments, the conductive material is a conductive composite structure 122 including a plurality of conductive materials. In some embodiments, the conductive composite structure 122 includes a work function metal element comprising TiN, TiAl, W, Ti, La, Hf, TaN, Al, or a combination thereof.

Figure 1L:
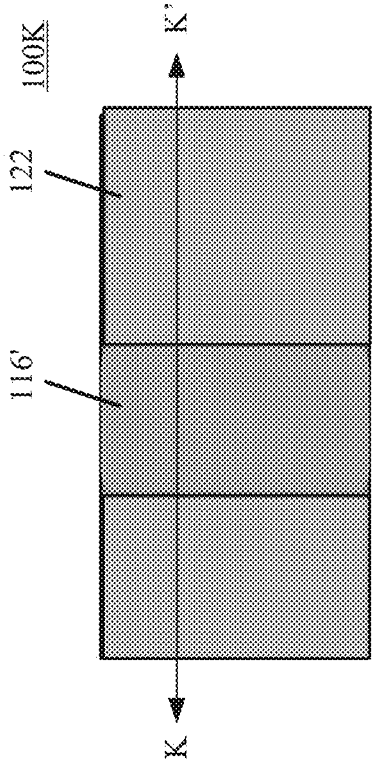

The IC device 100K in FIG. 1L is a plan view of the structure in the cross-sectional view of FIG. 1K (taken along plane K-K' of FIG. 1L) showing the upper surfaces of the etch stop pattern 116' and the uppermost layer of the conductive composite structure 122 that fills the primary contact openings 120 and extends over the residual dielectric regions 114 surrounding the primary contact openings 120.

Figure 1O:
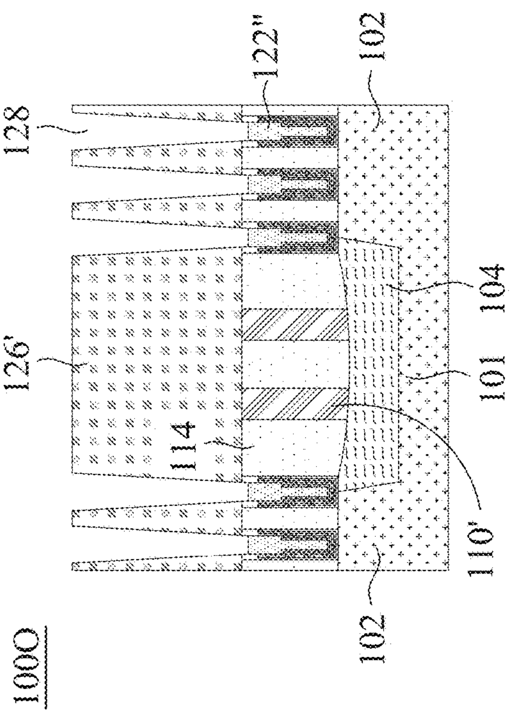
Figure 1M:
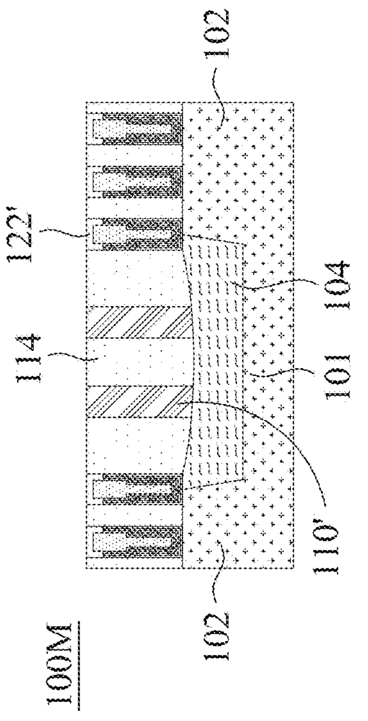

The IC device 100M in FIG. 1M is a cross-sectional view of an IC device at an operation subsequent to the operation of FIG. 1L according to some embodiments. The IC device 100M in FIG. 1M has been processed utilizing planarization operations to remove upper portions of the conductive composite structure 122 and leave an initial gate structure 122' (or contact structure) filling the primary contact openings 120 while also removing those portions of the conductive composite structure 122 that extended over residual dielectric regions 114. In some embodiments, the planarization operation also removes the etch stop pattern 116', upper portions of both the residual dielectric regions 114, and upper portions of the secondary polysilicon structures 110 to leave a residual portion of the secondary polysilicon structures 110' and form a planar surface 125. In some embodiments, the IC device is processed using a first CMP process using operating conditions selected for improved metal removal rather than the material(s), e.g., and ALD silicon nitride ($Si_xN_y$), used in forming the etch stop pattern 116'. Accordingly, a second CMP process using operating conditions selected for improved removal of the material(s) used in forming the etch stop pattern 116' is then used to complete removal of the etch stop pattern 116' to form a planar surface 125 for additional processing.

Figure 1N:
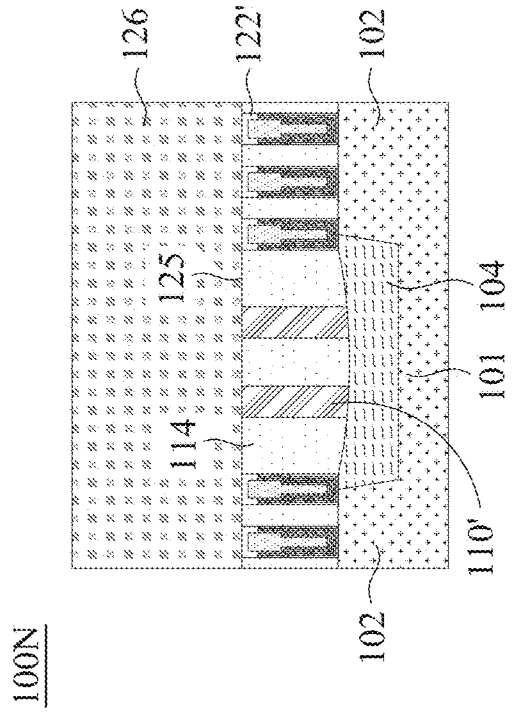

The IC device 100N in FIG. 1N is a cross-sectional view of an IC device at an operation subsequent to the operation of FIG. 1M according to some embodiments. The IC device 100N in FIG. 1N has been processed using a deposition or growth process for forming an interlayer dielectric layer 126 on the planar surface 125.

The IC device 100O in FIG. 1O is a cross-sectional view of an IC device at an operation subsequent to the operation of FIG. 1N according to some embodiments. The IC device 100O in FIG. 1O has been processed utilizing pattern and etch operations to form a contact etch pattern (not shown) on an upper surface of the interlayer dielectric layer 126 and then etch the wafer to remove exposed portions of the interlayer dielectric layer 126 to form initial contact openings 128 that are separated by residual portions of the interlayer dielectric layer 126'. In some embodiments, the etch operation also removes an upper portion of the initial gate structure 122' to form a final gate structure 122" that is recessed relative an upper surface of the residual dielectric regions 114.

Figure 1P:
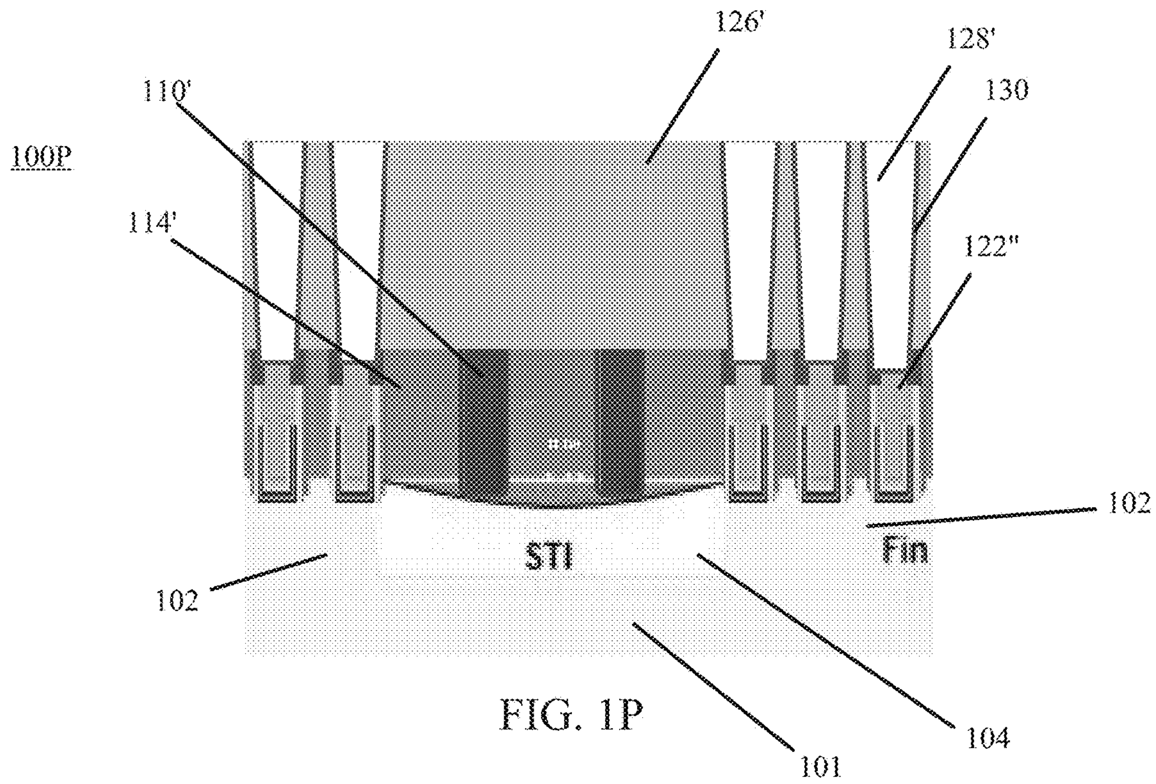

The IC device 100P in FIG. 1P is a cross-sectional view of an IC device at an operation subsequent to the operation of FIG. 1O according to some embodiments. The IC device 100P in FIG. 1P has been processed according to some embodiments utilizing growth and/or deposition operations and a planarization operation for forming a barrier metal layer 130 on the sidewall and bottom surfaces of the initial contact openings 128 and the final gate structure 122". The barrier metal layer 130 reduces the size of the initial contact openings 128 by about twice the thickness of the barrier metal layer to form secondary contact openings 128' that have a reduced diameter relative to the initial contact openings 128.

Figure 1Q:
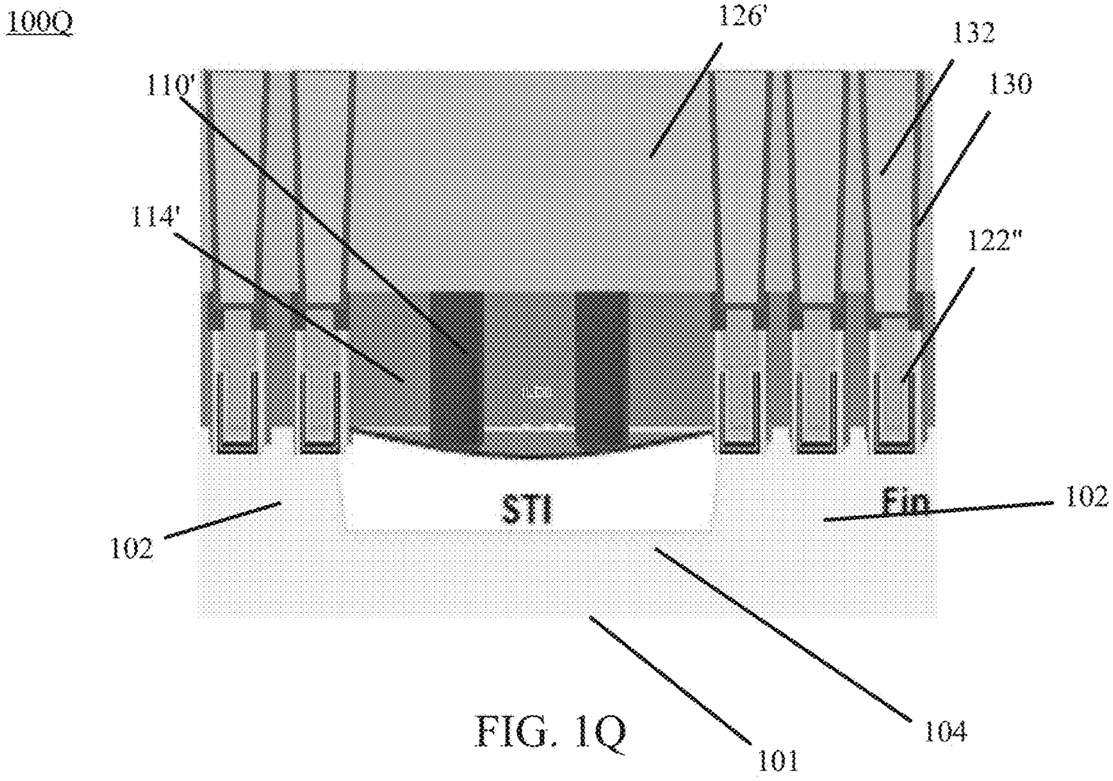

The IC device 100Q in FIG. 1Q is a cross-sectional view of an IC device at an operation subsequent to the operation of FIG. 1P according to some embodiments. The IC device 100Q in FIG. 1Q has been processed according to some embodiments utilizing growth and/or deposition operations and a planarization operation for filling the secondary contact openings 128' with a conductive material 132. In some embodiments, the first and second conductive materials are selected from a group including metals, metal alloys, and/or metal silicides. In some embodiments, the conductive material will include various combinations of materials to enhance the device performance and/or device longevity including, for example, a barrier layer, a liner layer, a wetting layer, an adhesion layer, a metal fill layer, and/or one or more other suitable layers. In some embodiments, the conductive material will be selected from Ti, Ag, Al, TiAlN, TaC, TaCN, TaSiN, Mn, Zr, TiN, TaN, Ru, Mo, Al, WN, Cu, W, Re, Ir, Co, Ni, and other conductive materials suitable for use in conjunction with polysilicon, and combinations and alloys thereof.

Figure 2A:
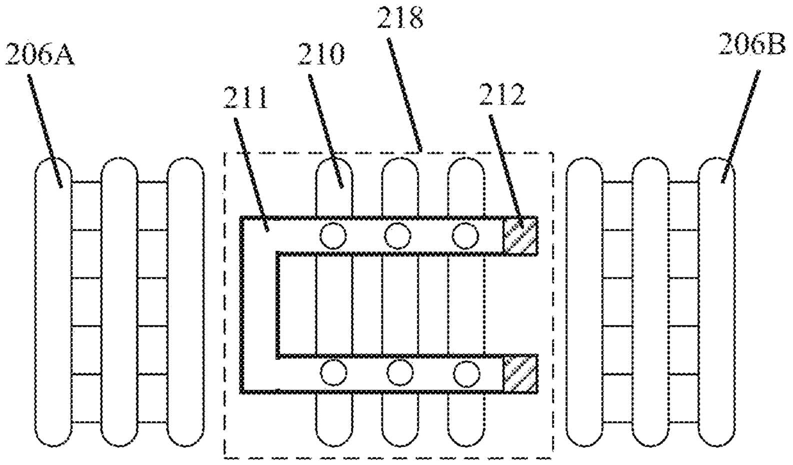
FIGS. 2A-2E are plan views of various semiconductor devices manufactured according to the manufacturing processes of some embodiments in which one or more functional elements are formed over isolation structure(s) on the surface of a semiconductor substrate.

FIG. 2A is a plan view of an embodiment of an IC device manufactured in accord with the operations disclosed in FIGS. 1A-1P in which a plurality of secondary polysilicon structures 210 are positioned over an isolation structure(s) 104 between a first plurality of primary polysilicon structures 206A and a second set of primary polysilicon structures 206B. In one embodiment, additional operations are performed after the operations reflected in FIG. 1M and before the addition of the interlayer dielectric layer 126 in order to electrically connect the secondary polysilicon structures 210 with a conductor 211 to form a resistor 218. In some embodiments, the secondary polysilicon structures 210 are removed and replaced with another conductor (not shown) in order to obtain a resistor 218 having a resistance within a predetermined resistance range. In some embodiments, ends of the conductor 211 are capped or terminated by a different conductive material 212 including, in some embodiments, a metal, a metal compound, or a metal alloy.

Figure 2C:
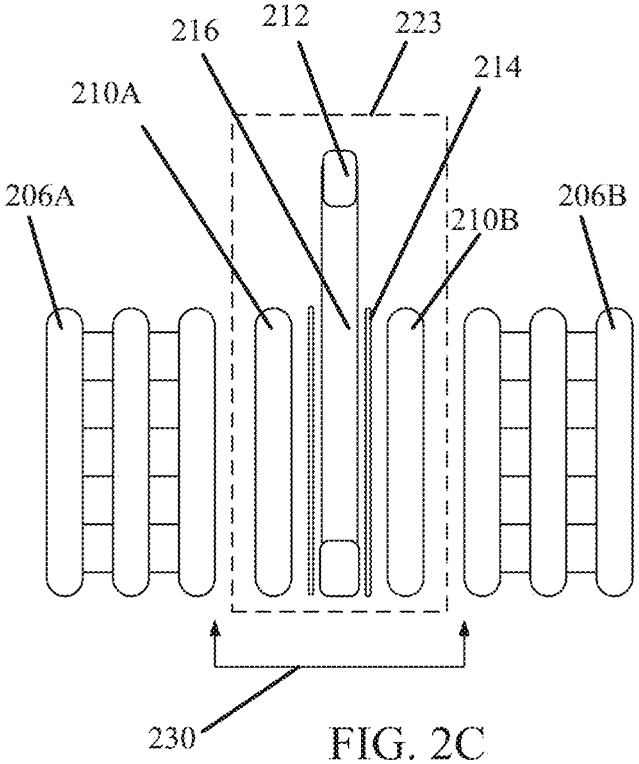
Figure 2B:
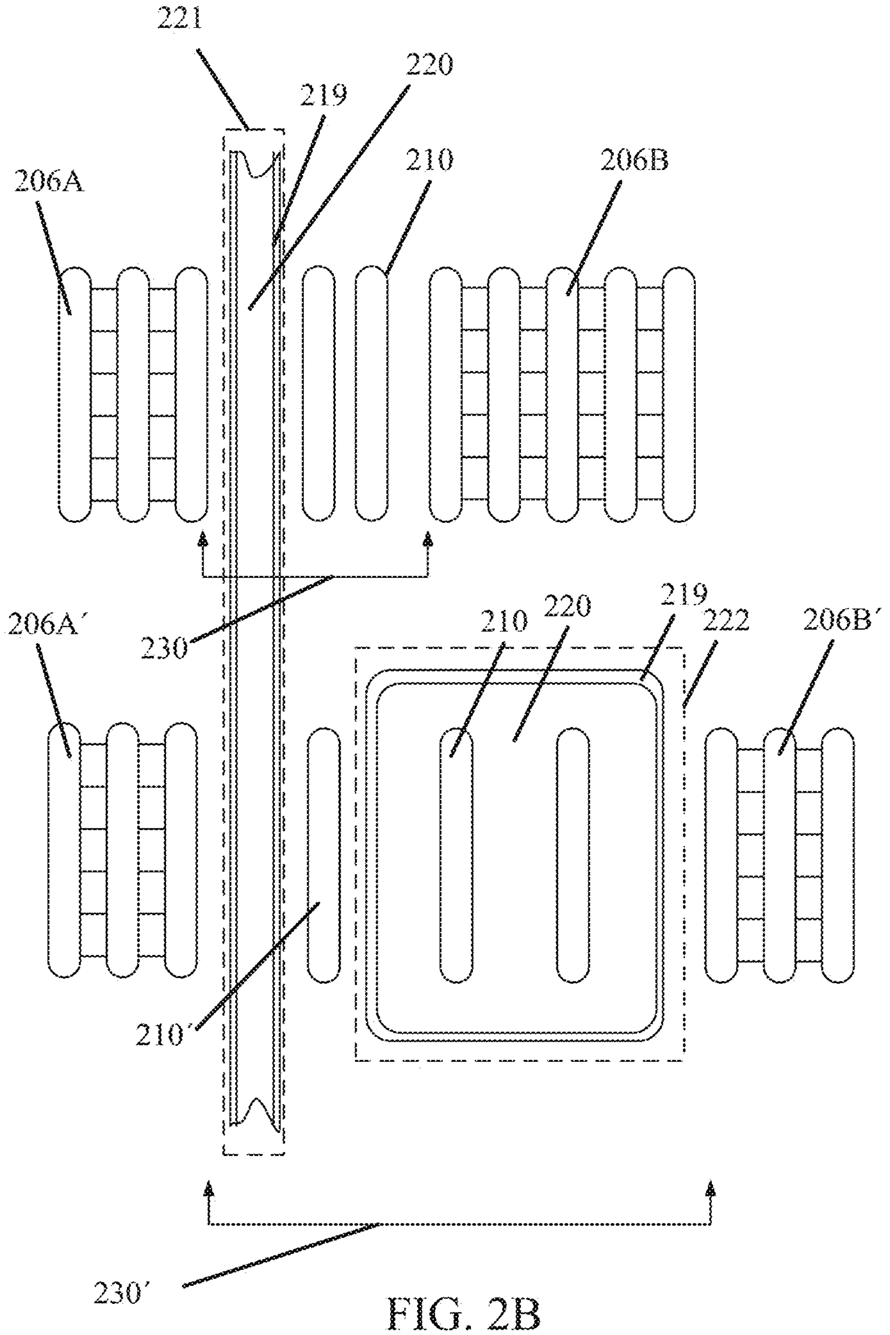

FIG. 2B is a plan view of an embodiment of an IC device manufactured in accord with the operations disclosed in FIGS. 5A-5L in which a first group of secondary polysilicon structures 210 are positioned in the spacing 230 between a first plurality of primary polysilicon structures 206A and a second set of primary polysilicon structures 206B. In some embodiments, at least one of the first group of secondary polysilicon structures 210 is removed and replaced by a composite conductor structure 221 comprising a barrier layer 219, such as titanium nitride (TiN), and a major portion of a conductive material 220 comprising, in some embodiments, tungsten (W) or a tungsten alloy. In some embodiments, the secondary polysilicon structures extend through a at least two sets of first and second pluralities of primary polysilicon structures 206 with the composite conductor structure 221 acting as a power rail for the distribution of Vdd throughout the IC device.

FIG. 2B also includes a plan view of an IC device with structures manufactured in accord with the operations disclosed in FIGS. 4A-4F and/or FIGS. 5A-5E. In some embodiments, a portion of the dielectric material 114' adjacent one or more of the secondary polysilicon structures 110 is removed to form an opening corresponding to secondary openings 111 in FIG. 4E around the secondary polysilicon structures 110. This secondary opening is then filled with a barrier layer 219, such as titanium nitride (TiN), and a major portion of a conductive material 220 comprising, in some embodiments, tungsten (W), to form a heat sink structure 222. In some embodiments, a portion of the secondary polysilicon structure 110 is removed to form secondary openings 111 in FIG. 4E. This secondary opening 111 is then filled with a barrier layer 219, such as titanium nitride (TiN), and a major portion of a conductive material 220 comprising, in some embodiments, tungsten (W), to form a heat sink structure 222. In some embodiments, the composite conductor structure 221 is utilized as a power rail to which a Vdd voltage is applied during testing and operation of semiconductor devices manufactured in accord with the methods and structures disclosed above. In some embodiments, the power rail structure will incorporate a structure that incorporates less work function metal(s) than are used in the corresponding gate structures.

In some embodiments, a semiconductor device manufactured according to the methods disclosed and configured in a manner consistent with FIG. 2B include a substrate, an isolation structure on the substrate and an active region on the substrate. In some embodiments, the active region includes a device comprising a source, a drain, a channel region and a gate electrode in which the gate electrode includes at least one work-function metal element. The structures formed over the isolation structure can be configured to utilize the space available between the active regions and provide the desired functionality.

In some embodiments, the original secondary polysilicon structures remain in place through the remainder of the semiconductor device processing. In other embodiments, one or more of the secondary polysilicon structures is removed and replaced by one or more other materials including, for example, oxide(s), metal(s), and polysilicon and may be configured in any shape consistent with the spacing available and the applicable design rules. A secondary polysilicon structure may be inserted above an isolation structure if the spacing between adjacent active regions is more than 1.5 times the contacted polysilicon pitch (CPP) (sometimes referred to as gate pitch). In some embodiments, the secondary polysilicon structure reduces the impact of loading effects during subsequent processing and thereby improves the uniformity of the primary polysilicon structures 106 and those functional elements that will be manufactured to take the place of the primary polysilicon structures.

In embodiments in which the spacing between adjacent active regions is greater than 2 times the CPP or gate pitch, at least two secondary polysilicon structures may be formed above the isolation structure. In some embodiments, at least one of the secondary polysilicon structures is removed and replaced with a conductor having a sidewall or adhesion/boundary layer of, for example, TiN, with the remainder of the opening being filled with another conductive material including, for example, tungsten or another metal or metals having conductivity sufficient to provide power rail lines that do not exhibit excessive electrical resistance. In some embodiments, conductors formed over a single isolation structure may be linked with conductors formed over other isolation structures to form a power rail structure that can be utilized during Back End of Line (BEOL) processing. In some embodiments, the secondary polysilicon structures 110 or the material(s) that replaced them can be processed using an ion implant process to adjust the electrical impedance of the structure(s).

As shown in FIG. 2B, in some embodiments the composite conductor structure 221 extends beyond the spacing 230 and extends through a second spacing 230'. In some embodiments, the second spacing 230' is defined between a third plurality of primary polysilicon structures 206A' and a fourth set of primary polysilicon structures 206B'. In some embodiments, the composite conductor structure 221 includes at least one of the secondary polysilicon structures 210 formed in second spacing 230'. In some embodiments, the composite conductor structure 221 utilizes fewer than all of the secondary polysilicon structures 210 formed in a spacing above an isolation structure (not shown) with the remaining secondary polysilicon structures 210 being available for constructing other elements. In some embodiments, one or more of the secondary polysilicon structures 210 may be surrounded by a composite conductor structure to form a heat-sink structure 222 comprising a barrier layer 219 and a major portion of a conductive material 220. In such embodiments, even absent electrical connection to another feature, the configuration identified as heat sink structure 222 can function as a heat sink for adjacent circuitry during operation of the final semiconductor device. In some embodiments, one or more of the secondary polysilicon structures 210 can be removed and replaced by a composite conductor structure that does not retain the internal secondary polysilicon structures 210.

FIG. 2C is a plan view of an embodiment of an IC device in which a first group of secondary polysilicon structures 210 are positioned in the spacing 230 between a first plurality of primary polysilicon structures 206A and a second set of primary polysilicon structures 206B. In some embodiments, an interior one of the first group of secondary polysilicon structures 210 is removed and replaced by a conductive material 216 comprising, for example, metal, a metal compound, a metal alloy, and/or polysilicon. In some embodiments, the conductive element 216 is capped or terminated with a different conductive material to cap the conductive element a resistor cap from materials selected from a metal, a metal compound, or a metal alloy. As shown in FIG. 2C, in some embodiments, semiconductor plates 214 are positioned between the conductive element 216 and the adjacent secondary polysilicon structures 210A and 210B to form a variable controllable resistor 223. In some embodiments, only a single semiconductor plate is used.

Figure 2D:
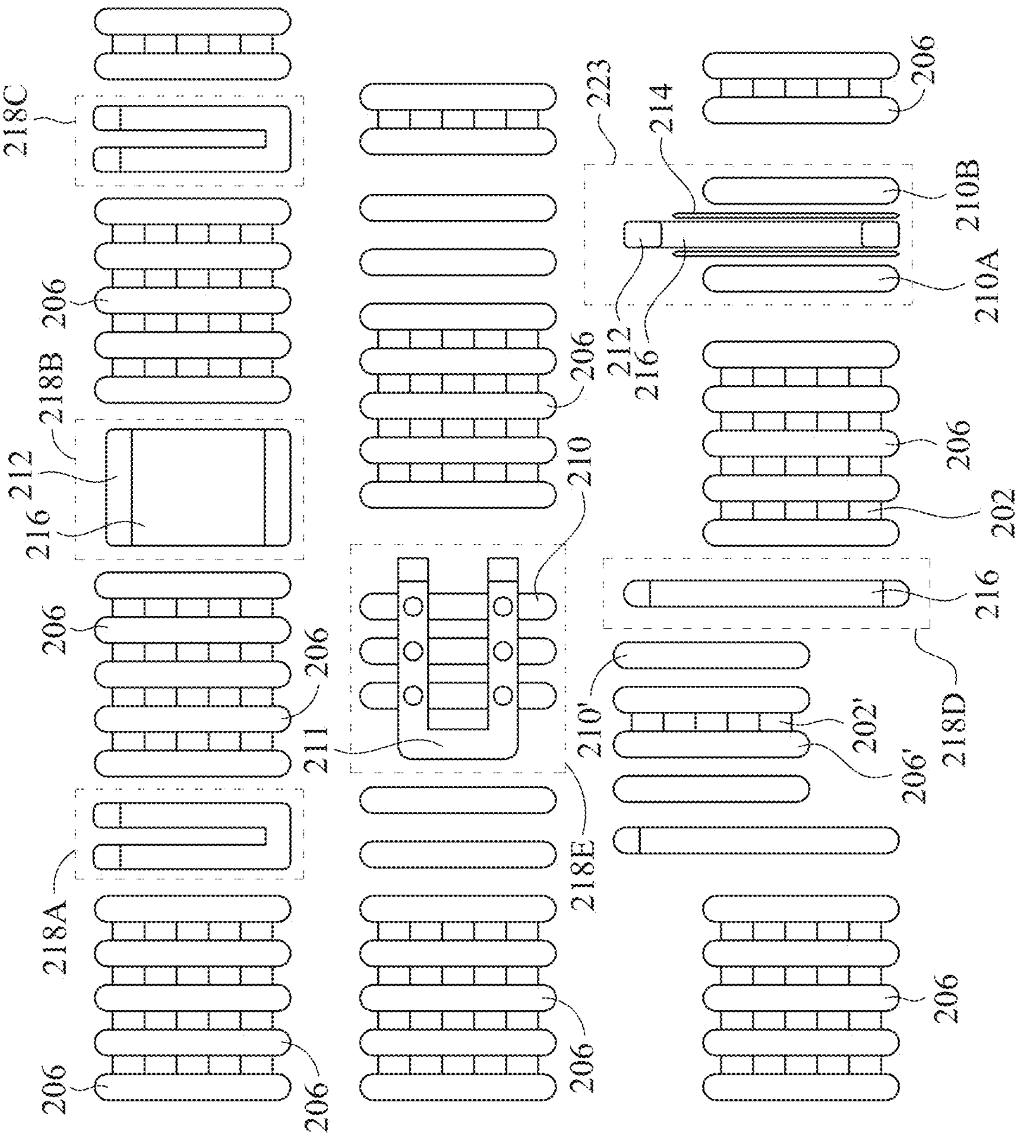

FIG. 2D is a plan view of an embodiment of an IC device incorporating a number of functional structures including resistors corresponding to the resistor embodiments discussed in connection with FIGS. 2A and 2C, 218E and 223. FIG. 2D also includes resistors configured according to other embodiments including c-shaped 218A, larger 218B, smaller 218C, and extended 218D. In some embodiments the resistors 218A-D comprise a main conductive element 216 formed from, for example, polysilicon, with resistor caps 212 formed using a material different than conductive element 216. FIG. 2D also incorporates a controllable variable resistor 223 comprising a conductive element 216, semiconductor plates 214, and adjacent secondary polysilicon structures 210A, 210B on either side of the conductive element 216 as detailed in connection with FIG. 2C. In some embodiments, one or more of the active regions 202' are offset vertically from other active regions 202 and the secondary polysilicon structures 210' can be offset accordingly to provide the benefits of the secondary polysilicon structures 210' to the structures in the offset primary polysilicon structures 206'.

Figure 2E:
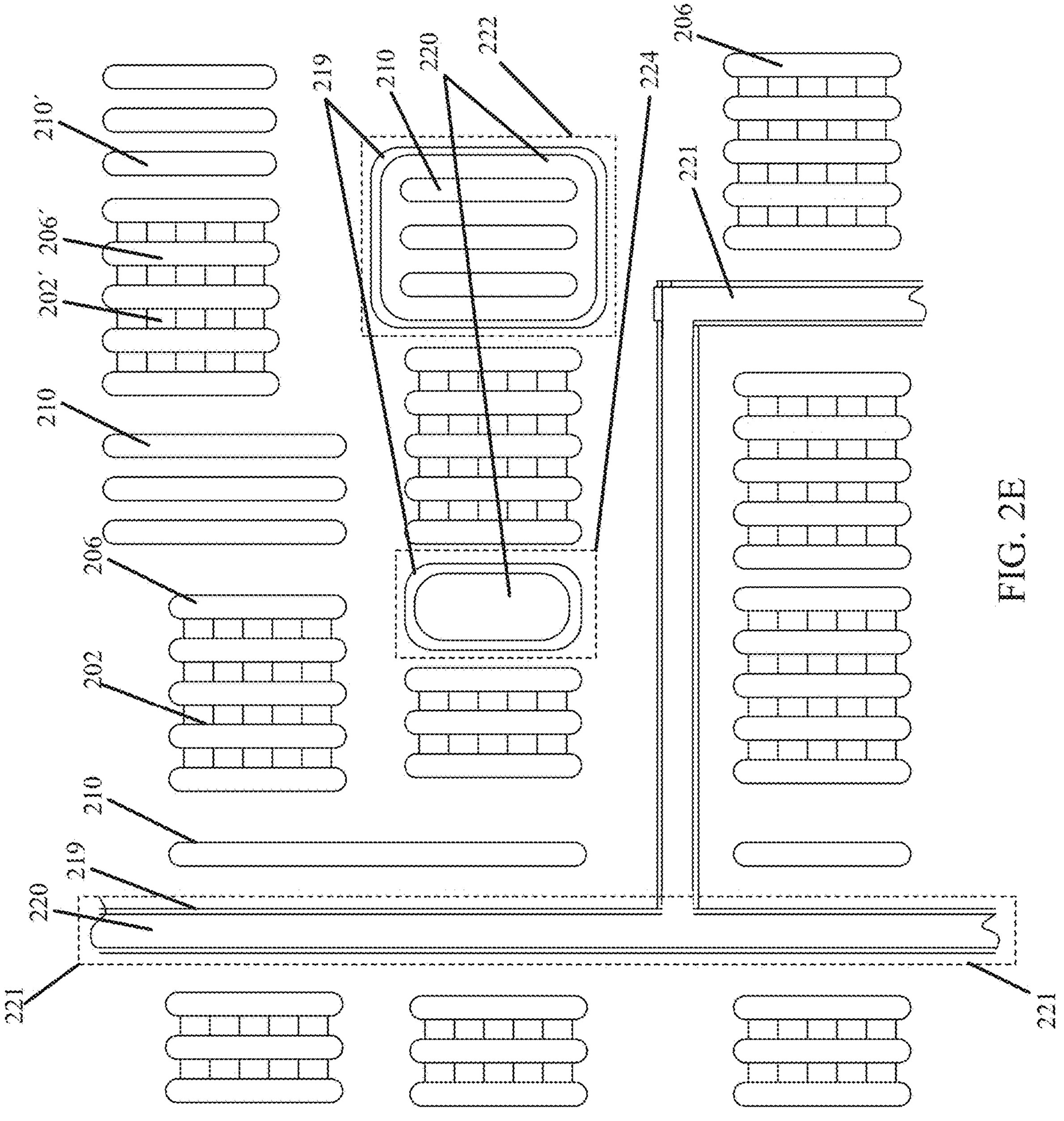

FIG. 2E is a plan view of an embodiment of an IC device incorporating a number of functional structures including power rails 221 ($V_{dd}$) and heat sink structures 222 (including a secondary polysilicon structure 210), 224 (without an includes secondary polysilicon structure 210) with varying configurations. In some embodiments the conductive functional structures comprise a barrier layer 219 formed from a first conductive material and a major portion of a second conductive material 220. In some embodiments, one or more of the active regions 202' are offset vertically from other active regions 202 and the associated secondary polysilicon structures 210', 210" are offset or extended accordingly to provide the benefits of the secondary polysilicon structures 210', 210" to the primary polysilicon structures 206" over the offset active regions 202'.

Figure 3A:
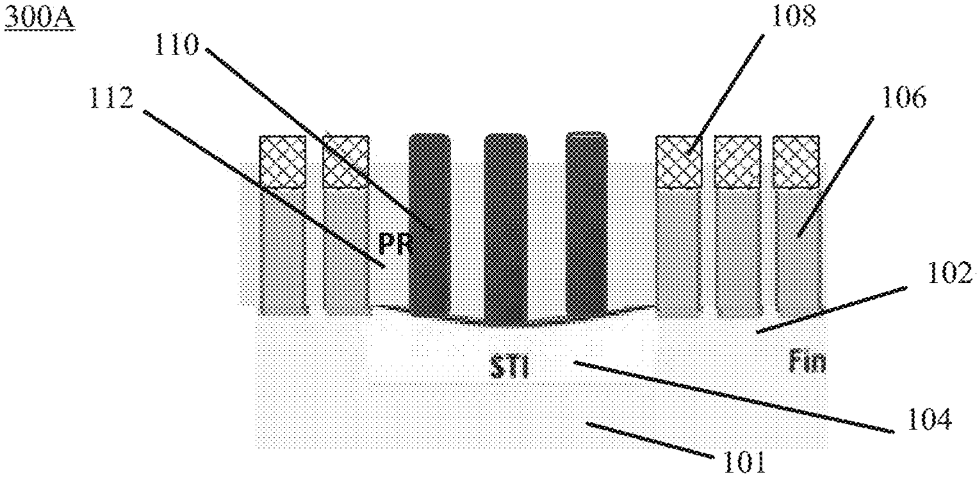
FIGS. 3A-3N are cross-sectional views of a semiconductor device during various operations of a semiconductor device manufacturing process, according to some embodiments.

FIG. 3A is a cross-sectional view of an IC device at an operation used in the manufacture of IC devices according to some embodiments. The IC device 300A in FIG. 3A includes a semiconductor substrate 101 having active regions 102 which are separated by isolation structure(s) 104 utilizing one or more dielectric materials.

The IC device 300A in FIG. 3A includes a series of primary polysilicon structures 106 over the active regions 102 that, in some embodiments have been etched from a first polysilicon layer (not shown) by removing the portions of the first polysilicon layer that are not covered by the hard mask pattern 108. The IC device 300A in FIG. 3A also includes one or more secondary polysilicon structures 110 formed over the isolation structure 104. In some embodiments, the primary polysilicon structures 106 and the secondary polysilicon structures 110 are both formed from the first polysilicon layer during the etch operation. In some embodiments, the secondary polysilicon structures 110 are formed after the primary polysilicon structures 106 by growing or depositing polysilicon on predetermined portions of the upper surface of the isolation structure 104 exposed by a photoresist pattern 112. In some embodiments according to FIG. 3A, the sizing and pitch of the secondary polysilicon structures 110 are configured to match the sizing and pitch of the primary polysilicon structures.

Figure 3B:
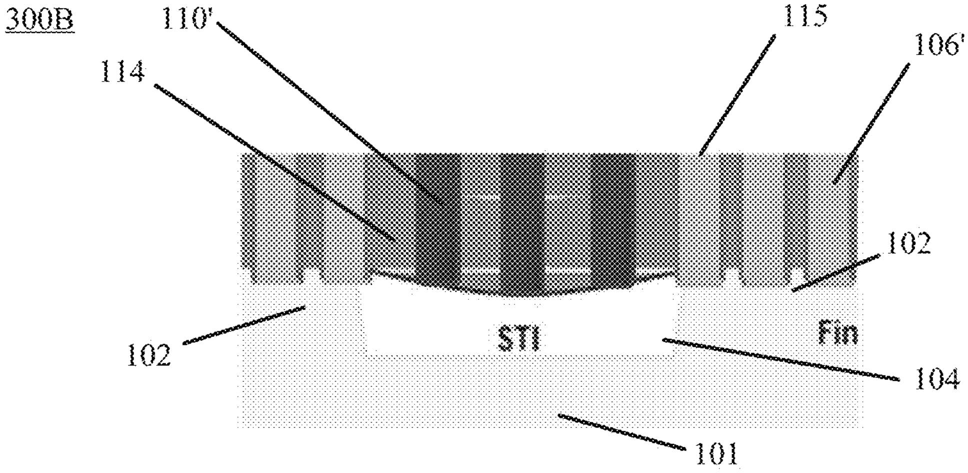

The IC device 300B in FIG. 3B is a cross-sectional view of an IC device at an operation subsequent to the operation of FIG. 3A according to some embodiments. The IC device 300B in FIG. 3B has been processed through a clean-up operation to remove the photoresist pattern 112 and a deposition operation to fill the spaces left by the removal of the photoresist pattern 112 with an interlayer dielectric (ILD) layer (not shown). A planarization process is then applied to remove the hard mask pattern 108 and the upper portions of the first interlayer dielectric layer, the secondary polysilicon structures 110, and the primary polysilicon structures 106. After the planarization process is complete, the residual portions of the primary polysilicon structures 106', the secondary polysilicon structure 110' and the residual dielectric regions 114 form a planar surface 115 that will be subjected to additional processing.

Figure 3C:
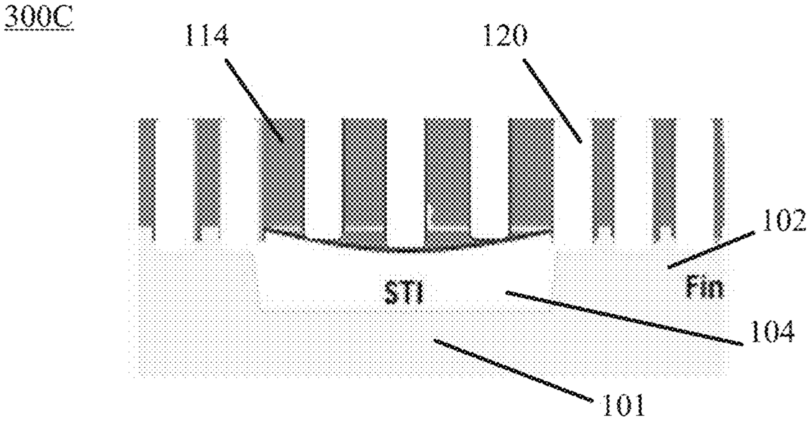

The IC device 300C in FIG. 3C is a cross-sectional view of an IC device at an operation subsequent to the operation of FIG. 3B according to some embodiments. The IC device 300C in FIG. 3C has been processed utilizing one or more etch operations to remove the residual portions of the primary polysilicon structures 106' and the residual portions of the secondary polysilicon structures 110' to form primary contact openings 120 in residual dielectric regions 114. By removing both the primary polysilicon structures 106 and secondary polysilicon structures 110 in the same operation, the embodiments of methods according to FIGS. 3A-3M avoid the need to protect the secondary polysilicon structures 110 during removal of the primary polysilicon structures 106. In this manner, the methods according to some embodiments can avoid, therefore, the deposition, patterning, etching, and removal operations associated with use of the contact etch stop layer 116 and etch stop pattern 116' reflected in FIGS. 1E-1L.

Figure 3D:
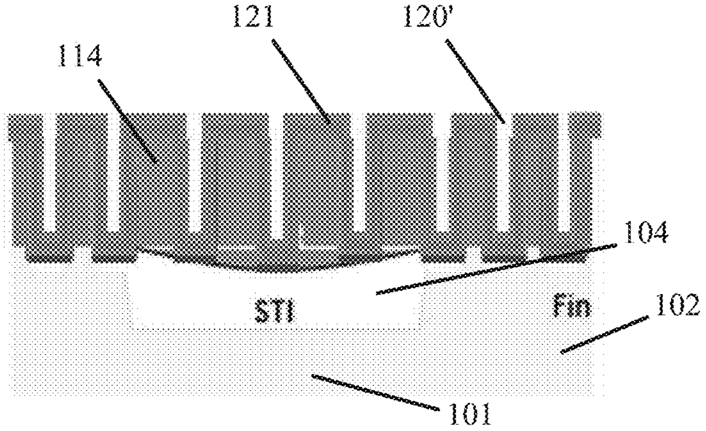

The IC device 300D in FIG. 3D is a cross-sectional view of an IC device at an operation subsequent to the operation of FIG. 3C according to some embodiments. The IC device 300D in FIG. 1D has been processed utilizing one or more deposition or growth operations to deposit initial layers (or, in some embodiments, a layer) of conductive material 121 in the primary contact openings 120. The deposition of the initial layers of conductive material 121 effectively reduces the size of the primary contact opening 120 and forms a reduced contact opening 120'.

Figure 3E:
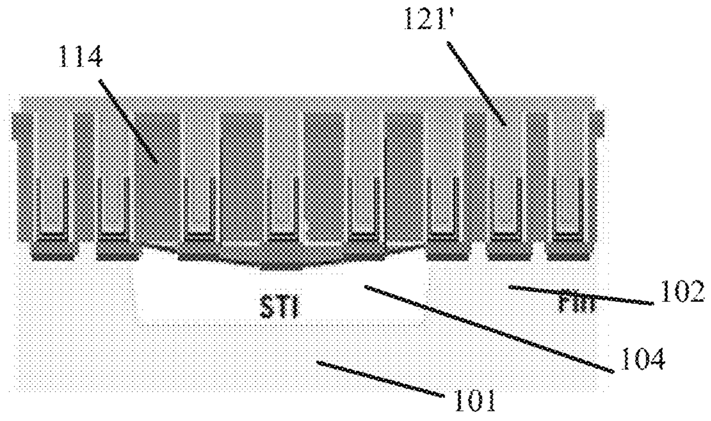

The IC device 300E in FIG. 3E is a cross-sectional view of an IC device at an operation subsequent to the operation of FIG. 3D according to some embodiments. The IC device 300E in FIG. 3E has been processed utilizing one or more deposition or growth operations to deposit additional layers (or, in some embodiments, a single layer) of conductive material to fill the remaining space in the reduced contact openings 120' and form a laminar conductive structure 121'.

Figure 3F:
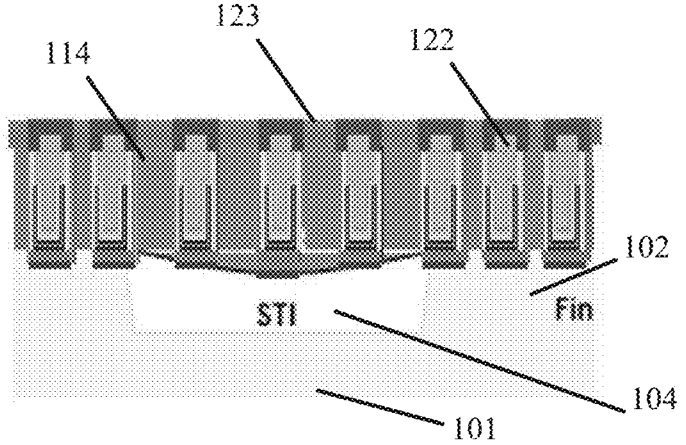

The IC device 300F in FIG. 3F is a cross-sectional view of an IC device at an operation subsequent to the operation of FIG. 3E according to some embodiments. The IC device 300F in FIG. 3F has been subjected to a planarization process to remove the upper portions of the laminar conductive structure 121', an etch process to remove a second upper portion of the residual portion of laminar conductive structure 121', and a deposition or growth operation to deposit an additional material on the remaining portion of the laminar conductive structure 121'. In some embodiments that utilize a deposition process, the layer of deposited additional material (not shown) is subjected to a planarization process to remove an upper portion of the additional material and form a planarized surface 123 in which the additional material forms the upper portion of the conductive composite structure 122.

Figure 3G:
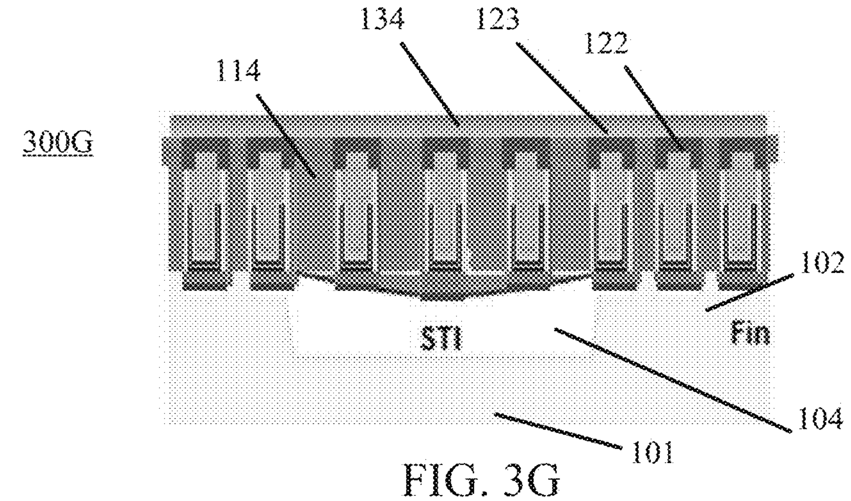

The IC device 300G in FIG. 3G is a cross-sectional view of an IC device at an operation subsequent to the operation of FIG. 3F according to some embodiments. The IC device 300G in FIG. 3G has been subjected to a deposition or growth process to form a contact etch stop layer 134 (CESL) over the planarized surface 123 produced in the operation of FIG. 3F.

Figure 3H:
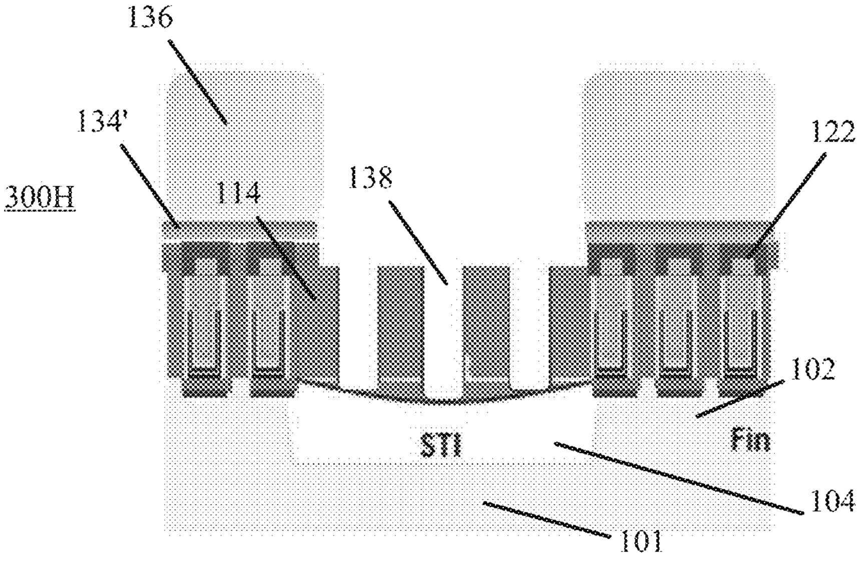

The IC device 300H in FIG. 3H is a cross-sectional view of an IC device at an operation subsequent to the operation of FIG. 3G according to some embodiments. The IC device 300H in FIG. 3H has been subjected to a patterning process for forming an etch pattern 136 over the surface of the contact etch stop layer 134. The etch pattern 136 is then used as an etch mask during a subsequent etch process for removing the exposed portions of the contact etch stop layer 134. Depending on the materials and etch chemistries utilized, one or more etch processes may be utilized to remove the exposed portions of the contact etch stop layer 134 to expose the upper surfaces of the conductive composite structures 122 and to remove the conductive composite structures 122 to form openings 138 over the isolation structure 104.

Figure 3I:
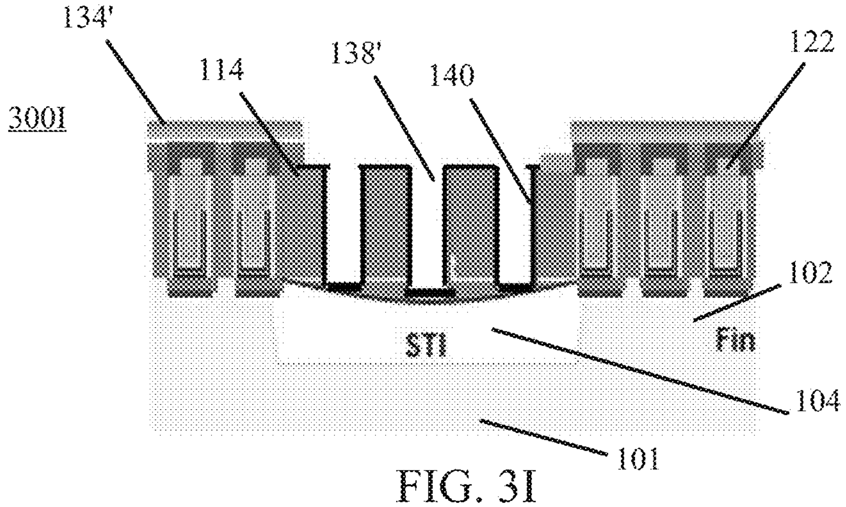

The IC device 300I in FIG. 3I is a cross-sectional view of an IC device at an operation subsequent to the operation of FIG. 3H according to some embodiments. The IC device 300I in FIG. 3I has been subjected to a deposition or growth process for forming a conformal layer 140 on the side and bottom surfaces of openings 138 and the exposed upper surfaces of exposed portions of residual dielectric regions 114 surrounding the openings 138. The formation of the conformal layer 140 reduces the size of opening 138, resulting in a reduced opening 138'.

Figure 3J:
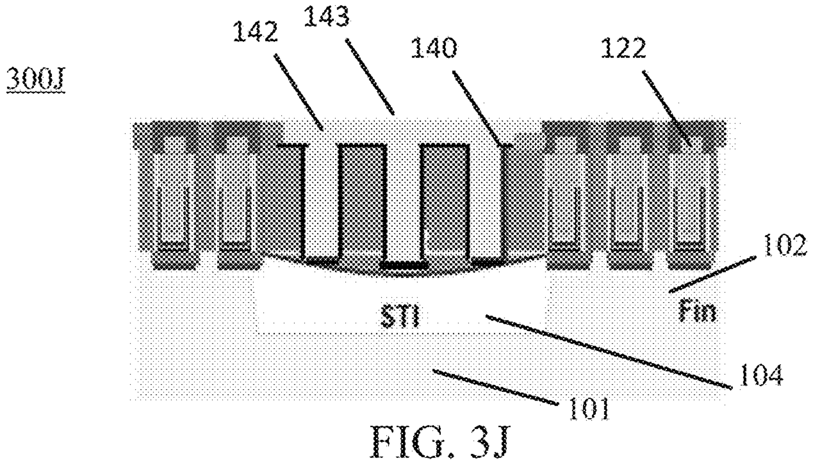

The IC device 300J in FIG. 3J is a cross-sectional view of an IC device at an operation subsequent to the operation of FIG. 3I according to some embodiments. The IC device 300J in FIG. 3J has been subjected to a deposition or growth process for forming a layer of an insulating layer (not shown) that fills the reduced opening 138' with an insulating material. The insulating layer is then subjected to a planarization process to remove an upper portion of the insulating material and leave a residual portion of the insulating material 142 filling the reduced openings and forming a planar surface 143 with the upper surfaces of the conductive composite structures 122.

Figure 3K:
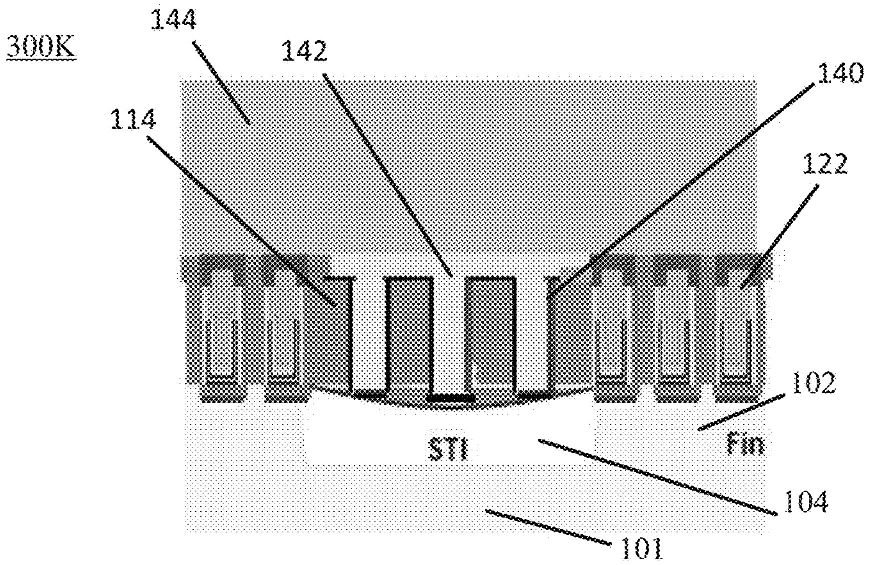

The IC device 300K in FIG. 3K is a cross-sectional view of an IC device at an operation subsequent to the operation of FIG. 3J according to some embodiments. The IC device 300K in FIG. 3K has been subjected to a deposition or growth process for forming an interlayer dielectric layer 144 over the planar surface 143.

Figure 3L:
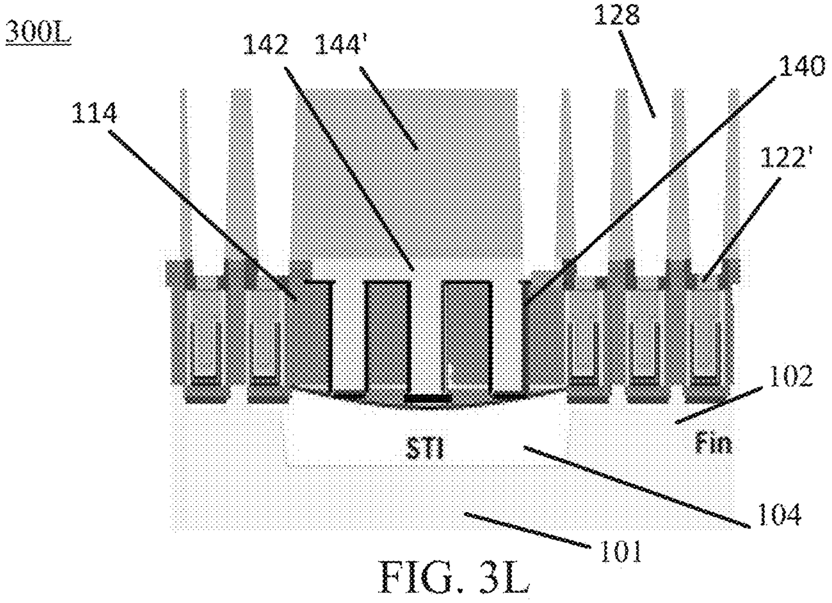

The IC device 300L in FIG. 3L is a cross-sectional view of an IC device at an operation subsequent to the operation of FIG. 3K according to some embodiments. The IC device 300L in FIG. 3L has been subjected to a patterning process that forms an etch mask (not shown) that exposes predetermined regions of interlayer dielectric layer 144 above the conductive composite structures 122 while protecting the structures formed above the isolation structure 104. The patterning process is followed by an etch process that uses the etch mask (not shown) to remove the predetermined regions of interlayer dielectric layer 144 and to form an interlayer dielectric pattern 144' with a plurality of initial contact openings 128. The etch process also removes an upper portion of the conductive composite structures 122 to form a modified version of the initial gate structure 122'.

Figure 3M:
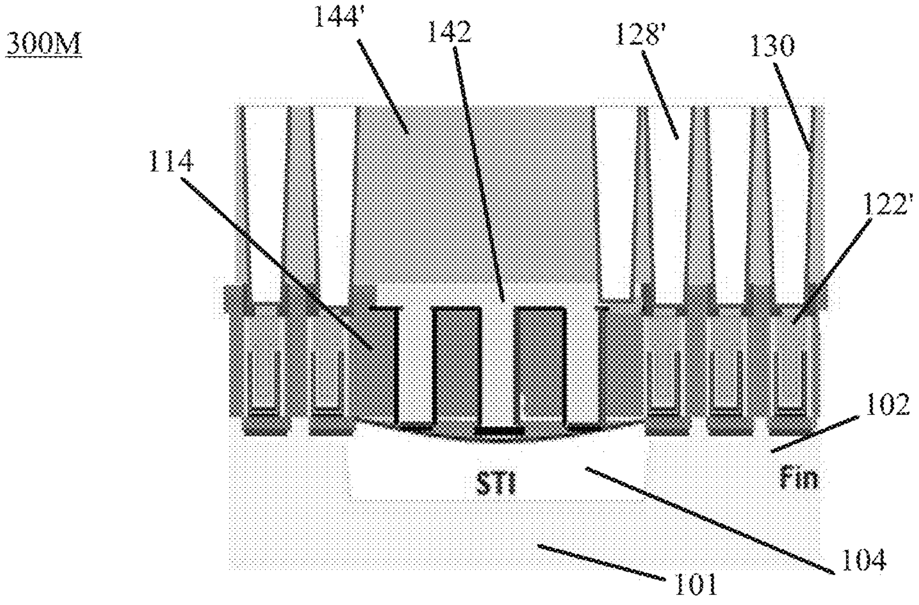

The IC device 300M in FIG. 3M is a cross-sectional view of an IC device at an operation subsequent to the operation of FIG. 3L according to some embodiments. The IC device 300M in FIG. 3M has been processed according to some embodiments utilizing growth and/or deposition operations and a planarization operation for forming a barrier metal layer 130 on the sidewall and bottom surfaces of the initial contact openings 128 and the final gate structure 122". The barrier metal layer 130 reduces the size of the initial contact openings 128 by about twice the thickness of the barrier metal layer to form secondary contact openings 128' that have a reduced diameter relative to the initial contact openings 128.

Figure 3N:
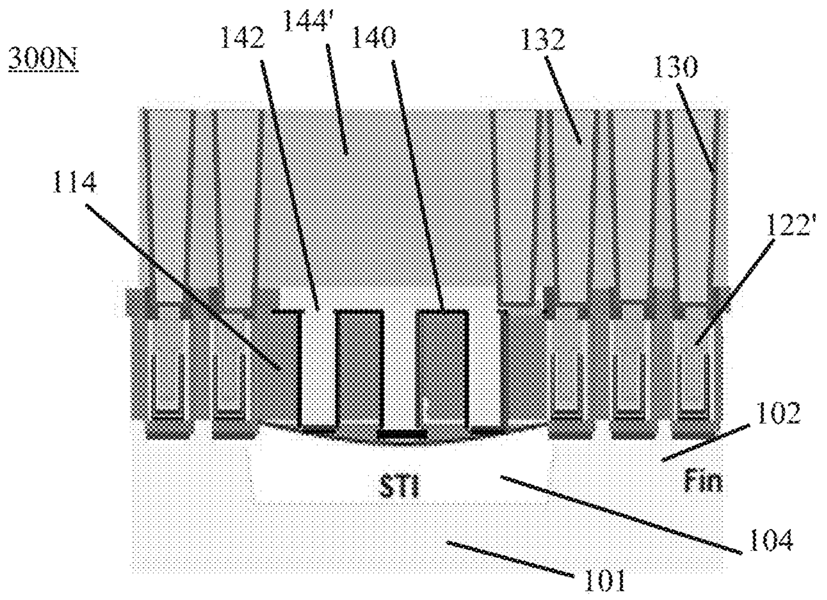

The IC device 300N in FIG. 3N is a cross-sectional view of an IC device at an operation subsequent to the operation of FIG. 3M according to some embodiments. The IC device 300N in FIG. 3N has been processed according to some embodiments utilizing growth and/or deposition operations and a planarization operation for filling the secondary contact openings 128' with a conductive material 132. In some embodiments, the first and second conductive materials are selected from a group including metals, metal alloys, and/or metal silicides.

In some embodiments, the conductive material will include various combinations of materials to enhance the device performance and/or device longevity including, for example, a barrier layer, a liner layer, a wetting layer, an adhesion layer, a metal fill layer, and/or one or more other suitable layers for. In some embodiments, the conductive material will be selected from Ti, Ag, Al, TiAlN, TaC, TaCN, TaSiN, Mn, Zr, TiN, TaN, Ru, Mo, Al, WN, Cu, W, Re, Ir, Co, Ni, and other conductive materials suitable for use in conjunction with polysilicon, and combinations and alloys thereof.

Figure 4A:
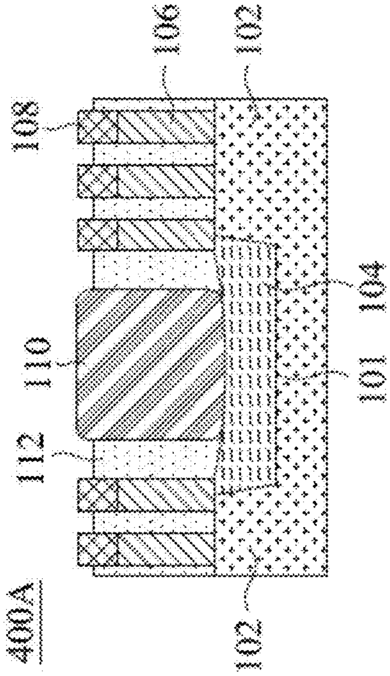
FIGS. 4A-4F are cross-sectional views of a semiconductor device during various operations of a semiconductor device manufacturing process, according to some embodiments.

The IC device 400A in FIG. 4A includes a series of primary polysilicon structures 106 over the active regions that, in some embodiments have been etched from a first polysilicon layer (not shown) by removing the portions of the first polysilicon layer that are not covered by the hard mask pattern 108. The IC device 400A in FIG. 4A also includes a secondary polysilicon structure 110 formed over the isolation structure 104. In some embodiments, the primary polysilicon structures 106 and the secondary polysilicon structures 110 are both formed from the first polysilicon layer during the etch operation. In some embodiments, the secondary polysilicon structure 110 is formed after the primary polysilicon structures 106 by growing or depositing polysilicon on predetermined portions of the upper surface of the isolation structure 104 exposed by a photoresist pattern 112.

Figure 4B:
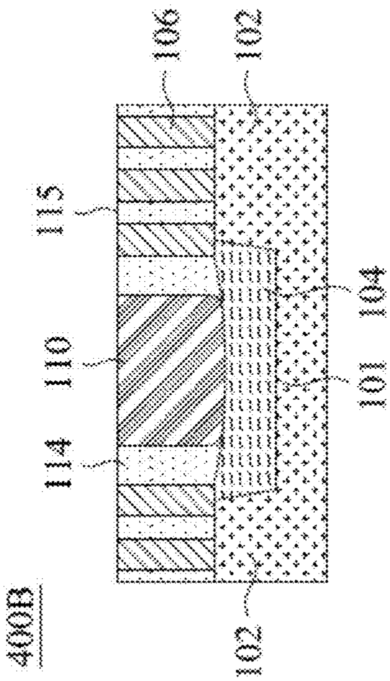

The IC device 400B in FIG. 4B is a cross-sectional view of an IC device at an operation subsequent to the operation of FIG. 4A according to some embodiments. The IC device 400B in FIG. 4B has been processed through a clean-up operation using chemical solutions (wet), plasma (dry), and/or ashing (dry) processes to remove the photoresist pattern 112 from between the primary polysilicon structures 106 and the secondary polysilicon structures 110. The photoresist removal operation is followed by deposition operation to fill the spaces left by the removal of the photoresist pattern 112 with an interlayer dielectric (ILD) layer (not shown). A planarization process is then applied to remove the hard mask pattern 108 and the upper portions of the first interlayer dielectric layer (not shown) to leave residual dielectric regions 114 separating the primary and secondary polysilicon structures, the secondary polysilicon structures 110, and the primary polysilicon structures 106 to form a planar surface 115.

Figure 4C:
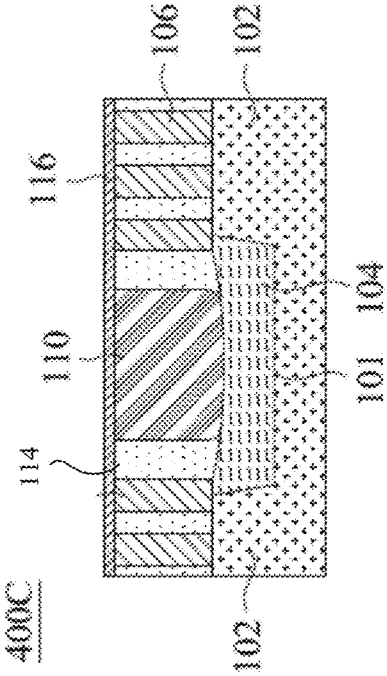

The IC device 400C in FIG. 4C is a cross-sectional view of an IC device at an operation subsequent to the operation of FIG. 4B according to some embodiments. The IC device 400C in FIG. 4C has been processed utilizing a deposition operation to apply a contact etch stop layer 116 (CESL) to the planar surface 115.

Figure 4D:
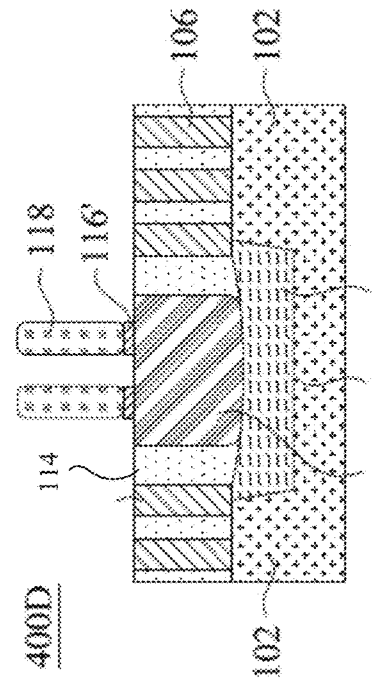
Figure 4D:
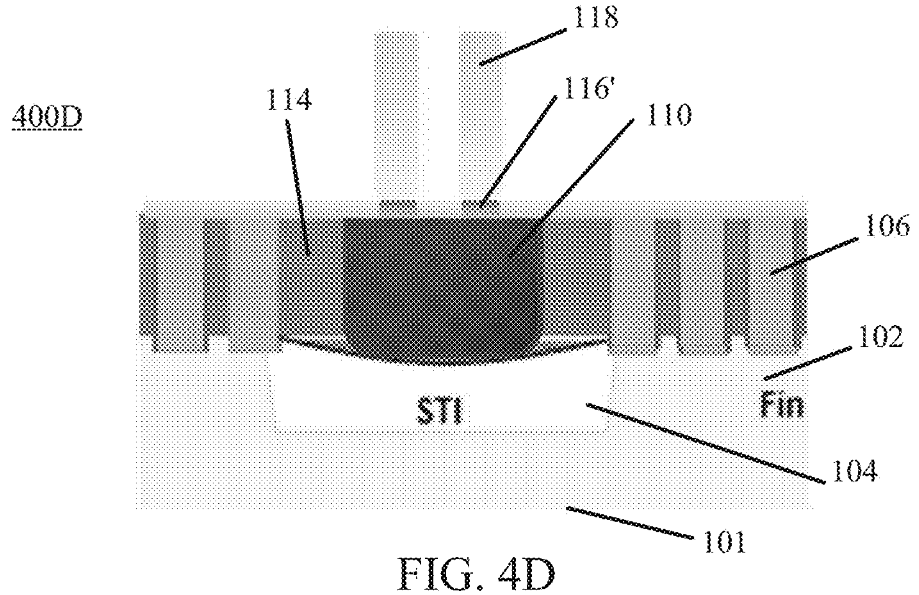

The IC device 400D in FIG. 4D is a cross-sectional view of an IC device at an operation subsequent to the operation of FIG. 4C according to some embodiments. The IC device 400D in FIG. 4D has been processed utilizing both a patterning operation and an etch operation. The patterning operation exposes and develops a photoresist layer (not shown) with the residual portions of the photoresist layer forming a photoresist pattern 118 that serves as an etch mask (not shown) for removing the exposed portions of the contact etch stop layer 116 and leaving a residual portion of the contact etch stop layer to form an etch stop pattern 116' to protect predetermined portions of the secondary polysilicon structures 110 while simultaneously exposing the upper surfaces of the primary polysilicon structures 106 and the residual dielectric regions 114 surrounding the primary polysilicon structures 106.

Figure 4E:
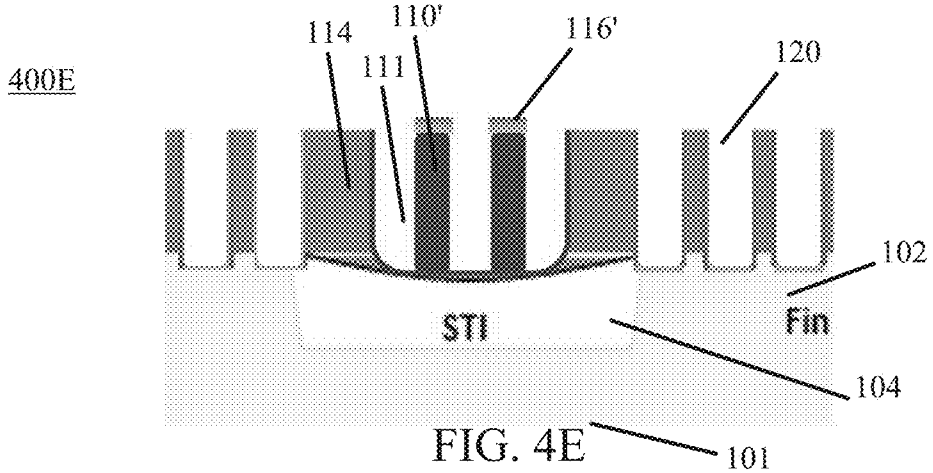

The IC device 400E in FIG. 4E is a cross-sectional view of an IC device at an operation subsequent to the operation of FIG. 4D according to some embodiments. The IC device 400E in FIG. 4E has been processed utilizing a cleanup operation to remove the photoresist pattern 118 and an etch operation to remove the primary polysilicon structures 106 and portions of the secondary polysilicon structures 110, thereby forming a series of primary contact openings 120 corresponding to the positions of the primary polysilicon structures 106, and a series of secondary openings 111 above the isolation structure 104 corresponding to the exposed portions of the secondary polysilicon structures 110. In some embodiments, the protected portions of the secondary polysilicon structures 110 form a plurality of secondary polysilicon structures 110' having widths that are a predetermined fraction of the original width of the secondary polysilicon structures 110.

In some embodiments, forming a larger secondary polysilicon structure 110 and then patterning and etching the larger secondary polysilicon structure 110 to form a plurality of smaller secondary polysilicon structures 110' creates a corresponding plurality of secondary openings 111 adjacent the secondary polysilicon structures 110'. In some embodiments, these additional secondary openings 111 provide a recess (or recesses) into which other materials, e.g., metal(s) and metal alloy(s) are deposited. In some embodiments, the materials deposited or formed in the secondary openings 111 form a heat sink or other structure that incorporates the secondary polysilicon structures 110'. Further, by forming secondary openings 111 by etching the larger secondary polysilicon structure 110, there is no need to remove the dielectric regions 114 adjacent the secondary polysilicon structures 110 as seen in, e.g., FIG. 1M. By avoiding the need for additional pattern and etch operations for removing the dielectric regions 114, manufacturing methods according to some embodiments are simplified.

Figure 4F:
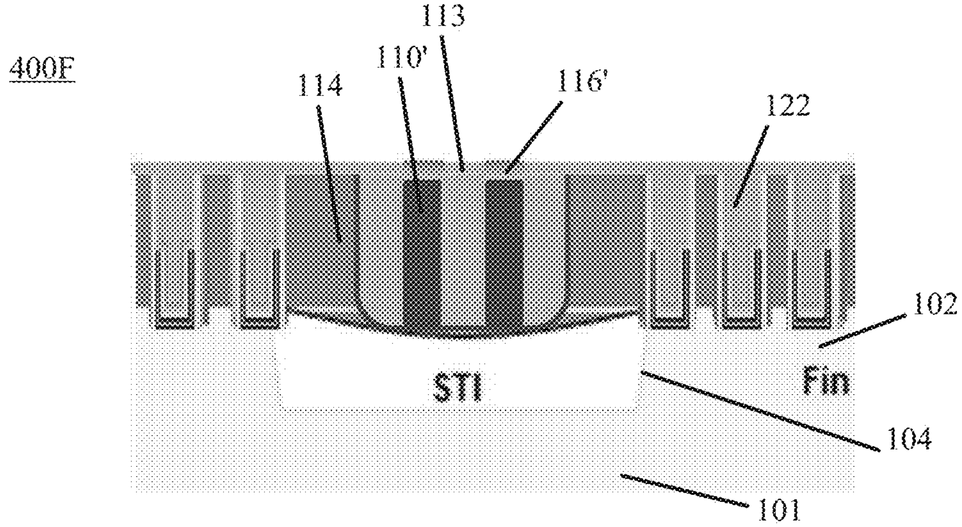

The IC device 400F in FIG. 4F is a cross-sectional view of an IC device at an operation subsequent to the operation of FIG. 4E according to some embodiments. The IC device 400F in FIG. 4F has been processed utilizing deposition operations, growth operations, and/or planarization operations to fill the primary contact openings 120 and secondary openings 111 with one or more conductive materials. In some embodiments, the conductive material is a conductive composite structure 122 including a plurality of conductive materials. In some embodiments, the conductive composite structure 122 includes a work function metal element comprising TiN, TiAl, W, Ti, La, Hf, TaN, Al, or a combination thereof. In some embodiments, the secondary openings 111 are filled primarily with a conductive material 113 to form a conductive structure that does not exhibit the multilayer (laminar) structure found in the conductive composite structures 122 (of which the conductive material 113 forms an upper portion in some embodiments) formed in primary contact openings 120.

Figure 5A:
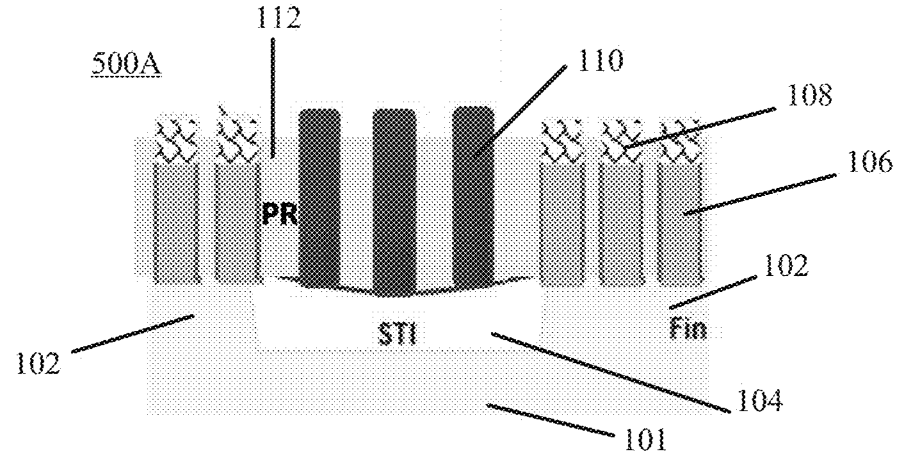
FIGS. 5A-5L are cross-sectional views of a semiconductor device during various operations of a semiconductor device manufacturing process, according to some embodiments.

FIG. 5A is a cross-sectional view of an IC device 500A at an operation used in the manufacture of IC devices according to some embodiments. The IC device 500A includes a semiconductor substrate 101 having active regions 102 which are separated by isolation structure 104 utilizing one or more dielectric materials have been formed. In some embodiments, the semiconductor substrate 101 is patterned and etched to form recessed regions (not shown) into which the dielectric material(s) is/are deposited to form isolation structure 104.

The IC device 500A includes a series of primary polysilicon structures 106 over the active regions 102 that, in some embodiments have been etched from a first polysilicon layer (not shown) by removing the portions of the first polysilicon layer that are not covered by the hard mask pattern 108. The IC device 500A also includes one or more secondary polysilicon structures 110 formed over the isolation structure 104. In some embodiments, the primary polysilicon structures 106 and the secondary polysilicon structures 110 are both formed from the first polysilicon layer during the etch operation. In some embodiments, the secondary polysilicon structures 110 are formed after the primary polysilicon structures 106 by growing or depositing polysilicon on predetermined portions of the upper surface of the isolation structure 104 exposed by a photoresist pattern 112.

Figure 5B:
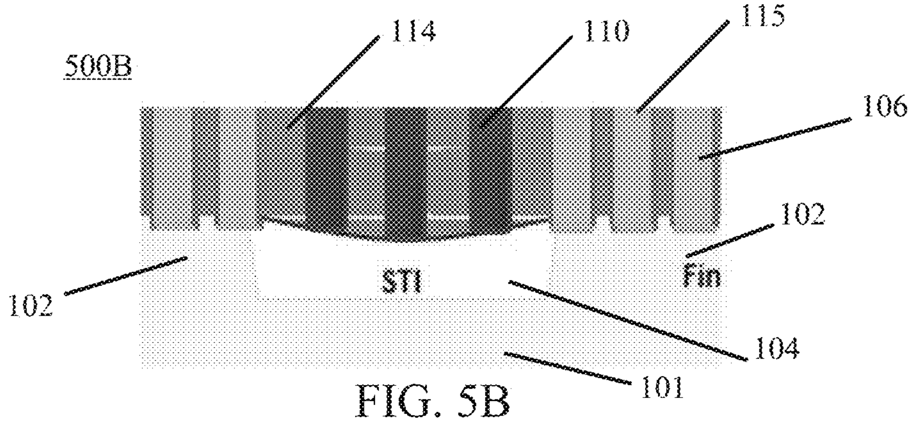

The IC device 500B in FIG. 5B is a cross-sectional view of an IC device at an operation subsequent to the operation of FIG. 5A according to some embodiments. The IC device 500B has been processed through a clean-up operation to remove the photoresist pattern 112 and a deposition operation to fill the spaces left by the removal of the photoresist pattern 112 with an interlayer dielectric (ILD) layer (not shown). A planarization process is then applied to remove the hard mask pattern 108 and upper portions the interlayer dielectric layer to leave residual dielectric regions 114, the secondary polysilicon structures 110, and the primary polysilicon structures 106 to form a planar surface 115.

Figure 5C:
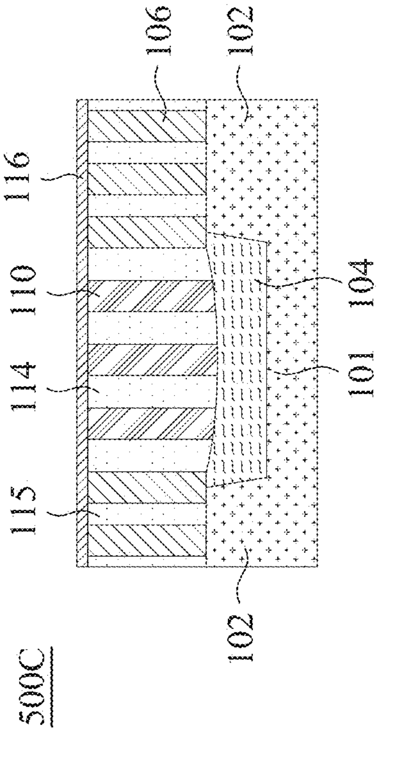

The IC device 500C in FIG. 5C is a cross-sectional view of an IC device at an operation subsequent to the operation of FIG. 5B according to some embodiments. The IC device 500C has been processed utilizing a deposition operation to apply a contact etch stop layer 116 (CESL) to the planar surface 115.

Figure 5D:
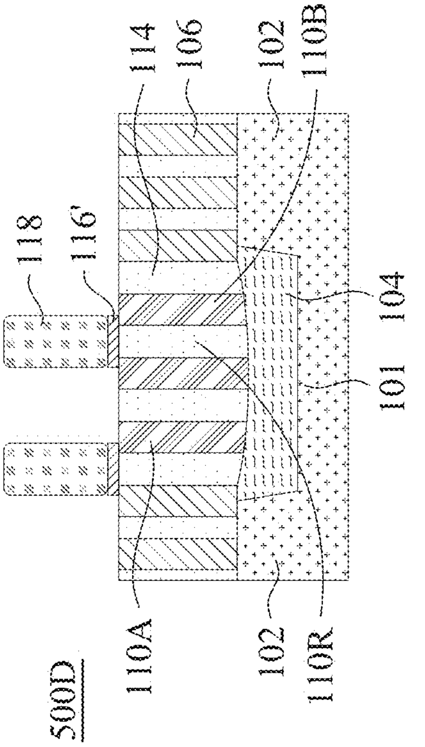

The IC device 500D in FIG. 5D is a cross-sectional view of an IC device at an operation subsequent to the operation of FIG. 5C according to some embodiments. The IC device 500D has been processed utilizing both a patterning operation and an etch operation. The patterning operation exposes and develops a photoresist layer (not shown) with the residual portions of the photoresist layer forming a photoresist pattern 118. The photoresist pattern 118 then serves as an etch mask for removing the exposed portions of the contact etch stop layer 116 and leaving a residual portion of the contact etch stop layer to form an etch stop pattern 116'. In some embodiments, the etch stop pattern 116' protects certain of the secondary polysilicon structures 110A. 110B while simultaneously exposing the upper surfaces of the primary polysilicon structures 106, certain of the secondary polysilicon structures 110R, and the residual dielectric regions 114 surrounding the primary polysilicon structures 106.

In methods according to some embodiments illustrated, e.g., in FIGS. 5A-5E, produce a functional component that is arranged both above the isolation structure 104, thereby preserving valuable active region 102 surface area for arrangement of the functional circuitry used by the final IC device when in operation. The functional components, in addition to being positioned above the isolation structure 104, are also generally parallel with the particular functional circuitry, thereby limiting the height of the final IC device while simultaneously providing some additional functionality. Some embodiments of the functional components will improve the operation and/or lifetime of the resulting devices by reducing resistance heating in adjacent circuitry during operation of the final IC device.

Figure 5E:
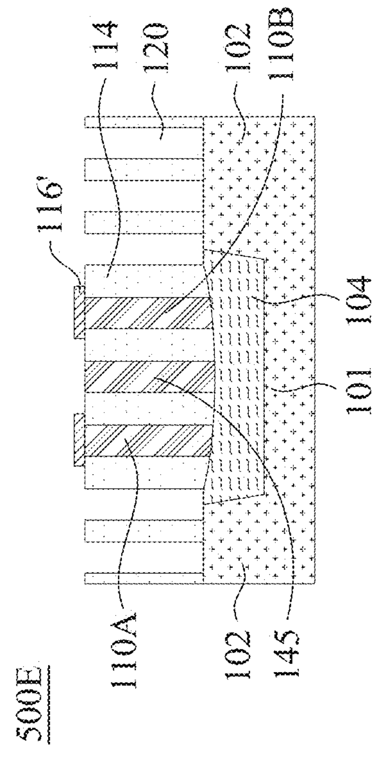

The IC device 500E in FIG. 5E is a cross-sectional view of an IC device at an operation subsequent to the operation of FIG. 5D according to some embodiments. The IC device 500E has been processed utilizing a cleanup operation to remove the photoresist pattern 118 and an etch operation to remove the primary polysilicon structures 106, certain of the secondary polysilicon structures 110B thereby forming a series of primary contact openings 120 corresponding to the positions of the primary polysilicon structures 106 and the exposed secondary polysilicon structures 110B. The opening (not shown) resulting from the removal of the exposed secondary polysilicon structures 110B has been processed utilizing a deposition or growth process to replace the exposed secondary polysilicon structures 110B with a conductive element 145.

In some embodiments the selective replacement of one of the secondary polysilicon structures 110R with a conductive structure, the introduction of coupling or control plates (see FIG. 2C), and the retained secondary polysilicon structures 110A, 110B result in the formation of a controllable variable resistor above the isolation structure 104.

Figure 5F:
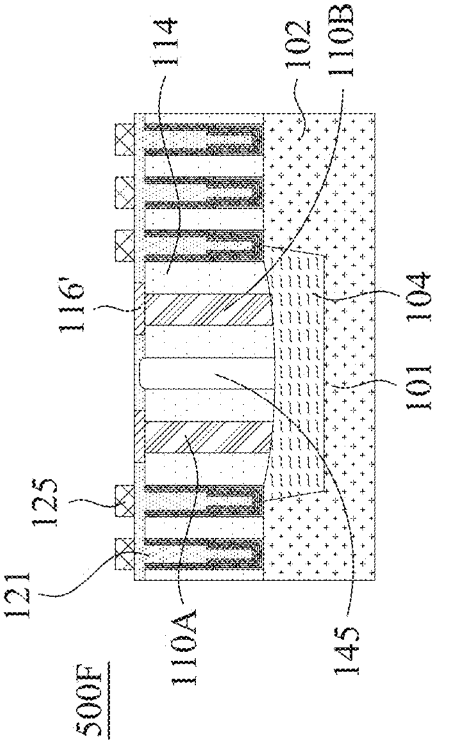

The IC device 500F in FIG. 5F is a cross-sectional view of an IC device at an operation subsequent to the operation of FIG. 5E according to some embodiments. The IC device 500F has been processed utilizing a series of growth and/or deposition processes to fill the primary contact openings 120 with a conductive material or, in some embodiments, a laminar structure including a series of different materials to form a conductive composite structure 122.

Figure 5G:
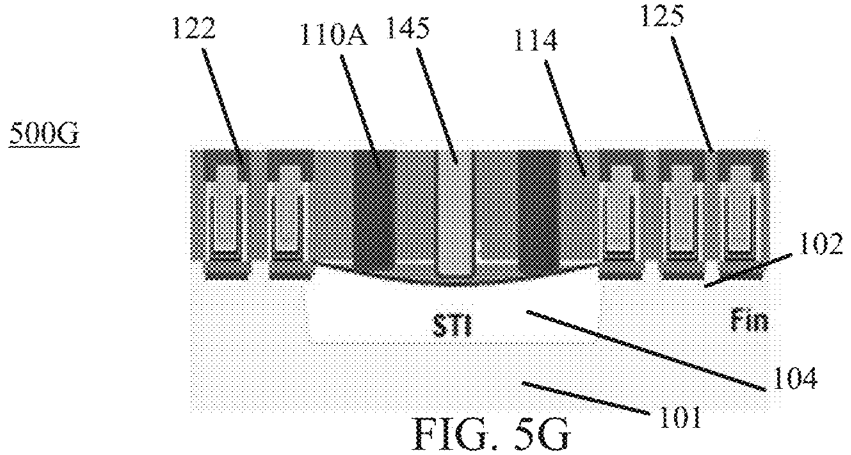

The IC device 500G in FIG. 5G is a cross-sectional view of an IC device at an operation subsequent to the operation of FIG. 5F according to some embodiments. The IC device 500G has been processed utilizing planarization operations to remove upper portions of the conductive composite structure 122, the etch stop pattern 116', the protected secondary polysilicon structures 110A, the conductive element 145, and the residual dielectric regions 114 to form a planar surface 125 for additional processing.

Figure 5H:
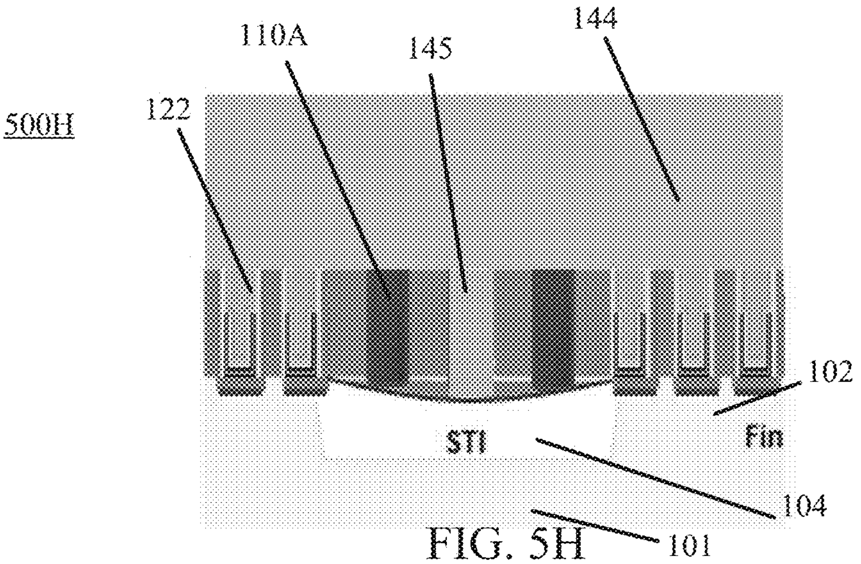

The IC device 500H in FIG. 5H is a cross-sectional view of an IC device at an operation subsequent to the operation of FIG. 5G according to some embodiments. The IC device 500H in FIG. 5H has been subjected to a deposition or growth process for forming an interlayer dielectric layer 144 over the planar surface 143.

Figure 5I:
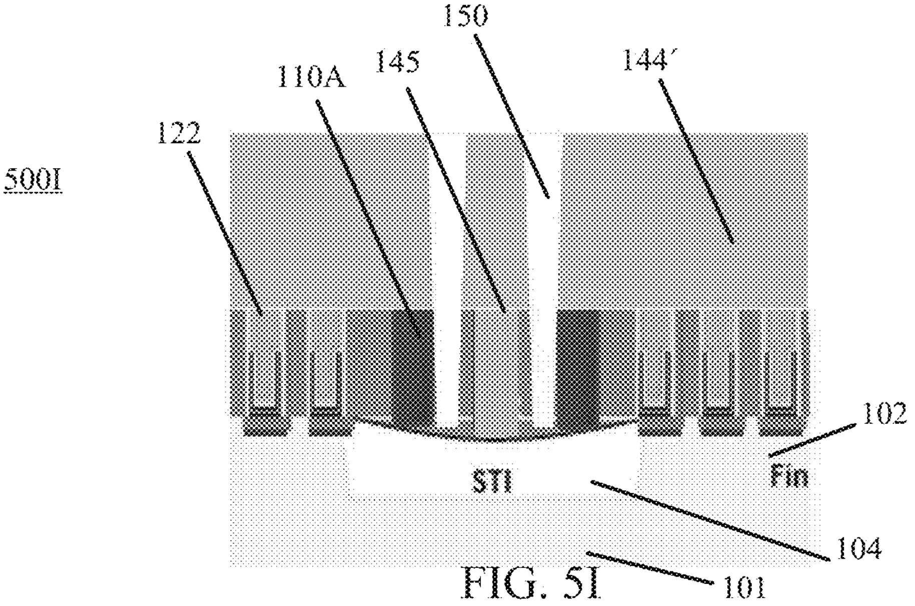

The IC device 500I in FIG. 5I is a cross-sectional view of an IC device at an operation subsequent to the operation of FIG. 5H according to some embodiments. The IC device 500I has been subjected to a patterning process that forms an etch mask (not shown) that exposes predetermined regions of interlayer dielectric layer 144 above the residual dielectric regions 114 adjacent conductive element 145 while protecting the structures formed above the active region 102. The patterning process is followed by an etch process that uses the etch mask (not shown) to remove the predetermined regions of interlayer dielectric layer 144 and to form an interlayer dielectric pattern 144' with a plurality of openings 150.

Figure 5J:
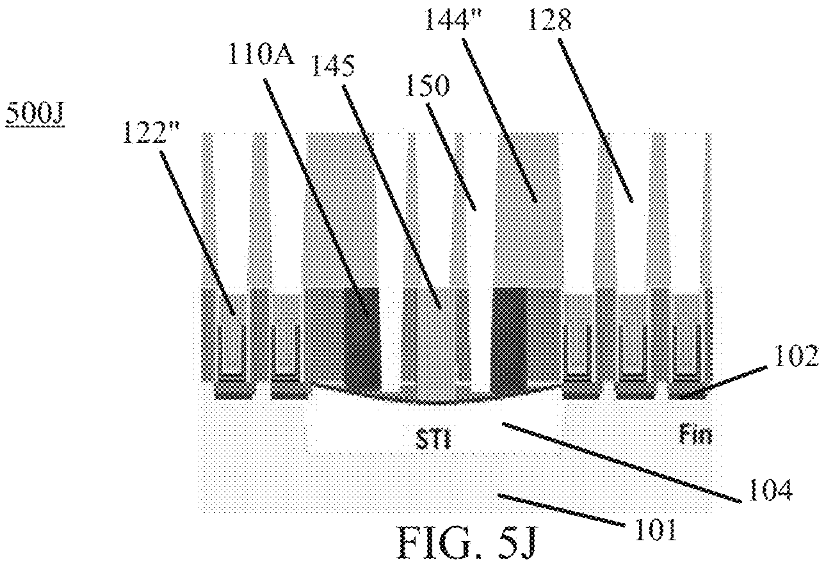

The IC device 500J in FIG. 5J is a cross-sectional view of an IC device at an operation subsequent to the operation of FIG. 5I according to some embodiments. The IC device 500J has been subjected to a patterning process that forms an etch mask (not shown) that exposes predetermined regions of interlayer dielectric pattern 144' above the conductive composite structure 122 and conductive element 145. The patterning process is followed by an etch process that uses the etch mask (not shown) to remove the predetermined regions of interlayer dielectric pattern 144' and to form a modified interlayer dielectric pattern 144" with a plurality of openings 150 and 128. In some embodiments, the plurality of openings 150 and 128 are opened using a single pattern and etch.

Figure 5K:
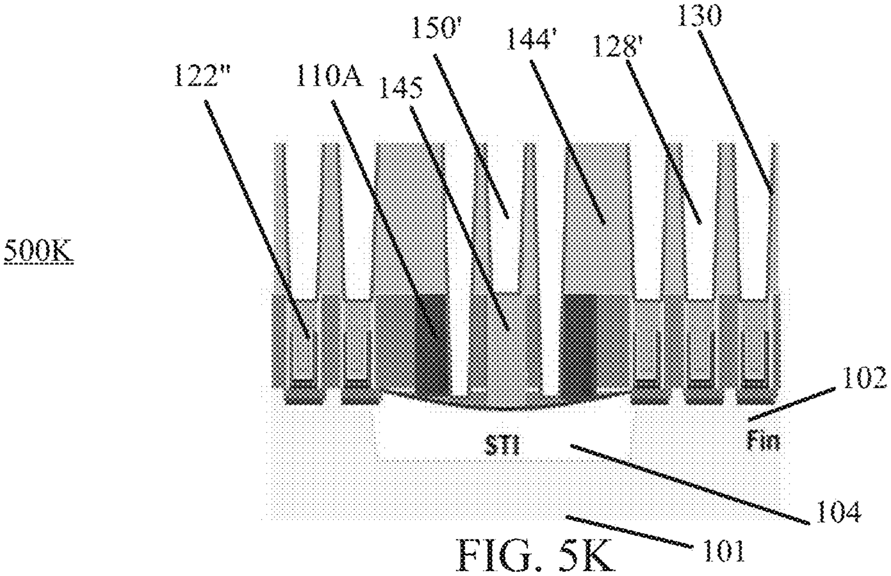

The IC device 500K in FIG. 5K is a cross-sectional view of an IC device at an operation subsequent to the operation of FIG. 5J according to some embodiments. The IC device 500K has been processed according to some embodiments utilizing growth and/or deposition operations and a planarization operation for forming a barrier metal layer 130 on the sidewall and bottom surfaces of the initial contact openings 128 to the final gate structure 122" and openings 150 to the secondary polysilicon structures 110A adjacent the conductive element 145. The barrier metal layer 130 reduces the size of the initial contact openings 128 by about twice the thickness of the barrier metal layer to form secondary contact openings 128' that have a reduced diameter relative to the initial contact openings 128. Similarly, in some embodiments, the barrier metal layer 130 reduces the size of the initial contact openings 150 by about twice the thickness of the barrier metal layer to form secondary contact openings 150' that have a reduced diameter relative to the initial contact openings 150.

Figure 5L:
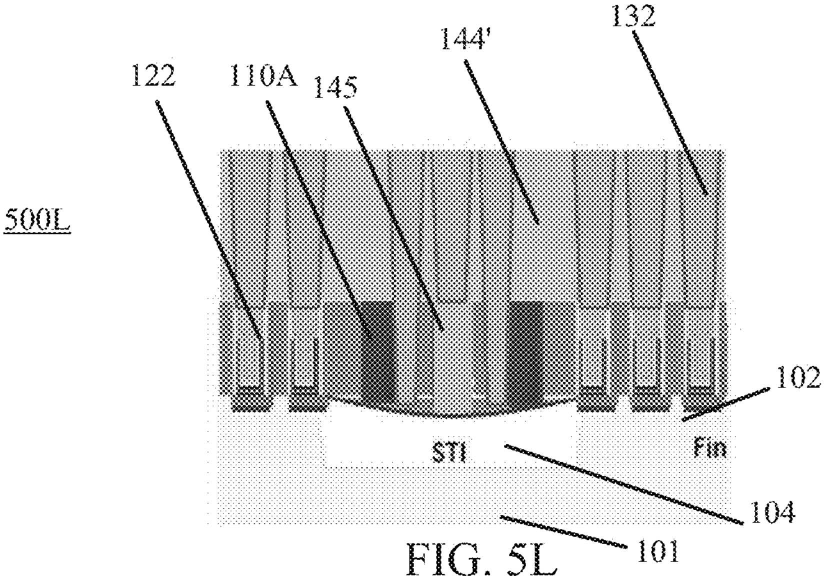

The IC device 500L in FIG. 5L is a cross-sectional view of an IC device at an operation subsequent to the operation of FIG. 5K according to some embodiments. The IC device 500L has been processed according to some embodiments utilizing growth and/or deposition operations and a planarization operation for filling the secondary contact openings 128' and the with a conductive material 132. In some embodiments, the first and second conductive materials are selected from a group including metals, metal alloys, and/or metal silicides.

Figure 6A:
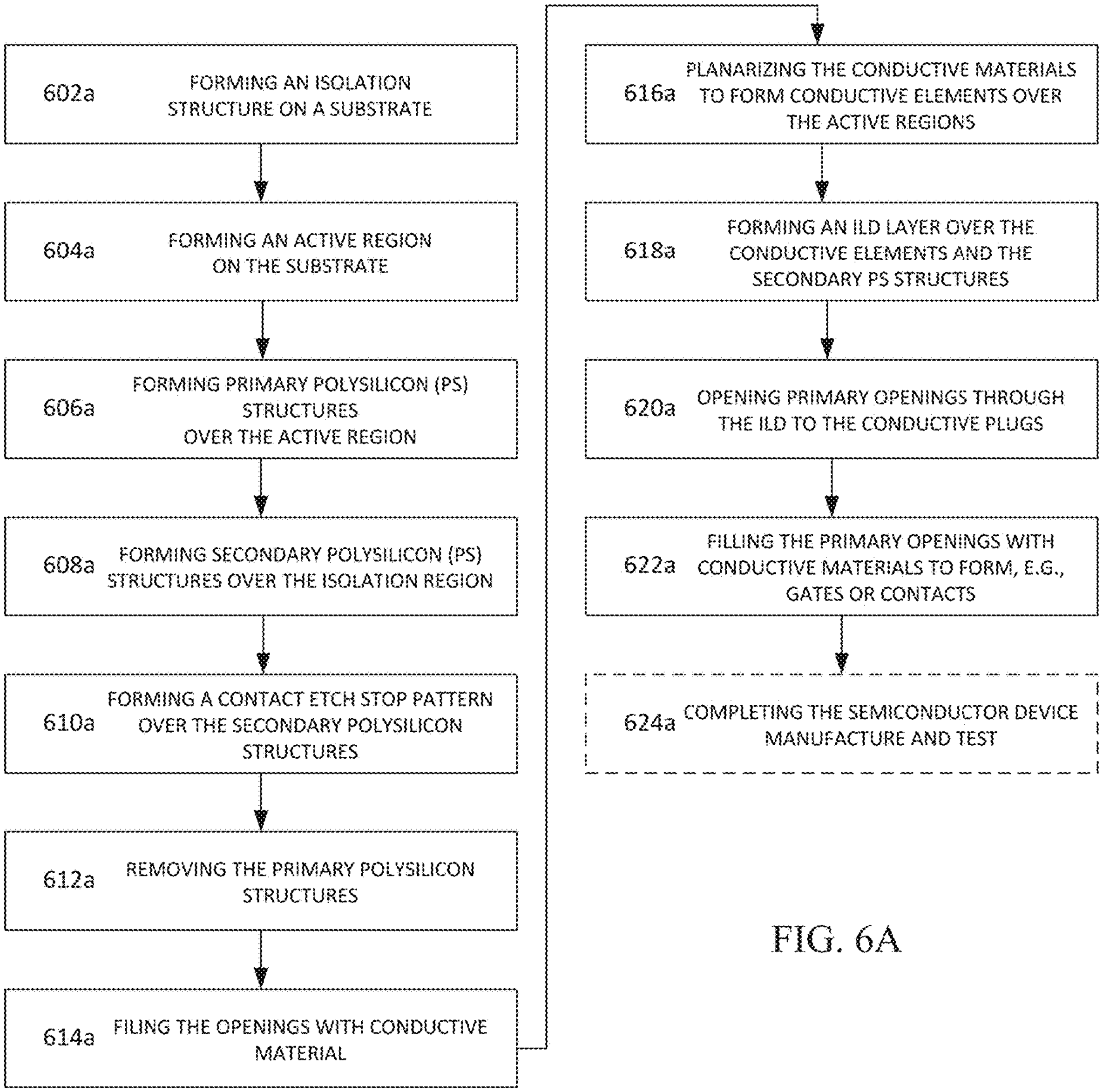
FIGS. 6A-6F are flowcharts of manufacturing processes for the production of IC devices according to some embodiments.

FIG. 6A is a flowchart of a manufacturing process 600A for the production of IC semiconductor devices according to some embodiments. In some embodiments, manufacturing process 600A is used to manufacture an IC device according to FIGS. 1A-P and references to the structures identified above in connection with FIGS. 1A-P are incorporated below to aid in the understanding the flowchart of FIG. 6A and not by way of limiting the application of manufacturing process 600A.

Embodiments according to FIG. 6A include operation *602a* during which the substrate, e.g., a semiconductor substrate 101, is prepared and certain FEOL operations are completed to manufacture, for example, isolation structure 104, e.g., shallow trench isolation (STI) structures. In some embodiments the final layer or layers of material applied to the surface of the substrate is/are planarized using an etch-back and/or CMP process to remove upper portions of at least some of the material layers present on the semiconductor substrate 101 to prepare the surface for subsequent processing.

Embodiments according to FIG. 6A include operation *604a* during which the substrate, e.g., a semiconductor substrate 101, is prepared and certain FEOL operations are completed to manufacture, for example, active regions 102, over which certain functional elements are subsequently formed to provide the desired functionality and performance of the resulting semiconductor device. In some embodiments the order of the operations *602a* and *604a* are reversed.

Embodiments according to FIG. 6A include operation *606a* during which primary polysilicon structures 106 are formed over the active regions 102 of the substrate in order to establish the spacing and the dimensions of a functional element that will subsequently replace the primary polysilicon structures.

Embodiments according to FIG. 6A include operation *608a* during which secondary polysilicon structures 110 are formed over the isolation structure(s) 104 of the substrate in order to establish, at least in part, the spacing and the dimensions of a functional element that will subsequently replace the secondary polysilicon structures. In some embodiments the order of the operations *606a* and *608a* are reversed while in other embodiments, the operations *606a* and *608a* are performed simultaneously.

Embodiments according to FIG. 6A include operation *610a* during which a contact etch stop layer 116 is formed over the device surface and is then patterned and etched to form an etch stop pattern 116' that selectively exposes or protects certain of the primary polysilicon structures 106 and/or the secondary polysilicon structures 110. In operation *610a*, however, the etch stop pattern 116' is utilized for protecting the secondary polysilicon structures 110 that are formed over the isolation structures 104 of the substrate.

Embodiments according to FIG. 6A include operation *612a* during which the etch stop pattern 116' is used as an etch mask that exposes the primary polysilicon structures 106 to the etch processes. Removing the polysilicon from the primary polysilicon structures 106 forms a corresponding series of primary contact openings 120 above the active region 102.

Embodiments according to FIG. 6A include operations *614a* and *616a* during which the primary contact openings 120 are filled with a number of conductive layers which, in some embodiments, comprise a series of conductive layers 121 over the active region 102 and are planarized to form a series of conductive plugs or initial gate structures 121', e.g., gate structures, and prepare a planar surface 125 for additional processing.

Embodiments according to FIG. 6A include operation *618a* during which an interlayer dielectric layer 126 is formed for separating and insulating the conductive structures from higher level metallization (not shown) which the primary contact openings 120 are filled with a number of conductive composite layers 122 which, in some embodiments, comprise a gate structure for transistors arranged above the active region 102.

Embodiments according to FIG. 6A include optional operation *620a* in some embodiments during which a contact pattern is formed on the interlayer dielectric layer 126. The exposed portions of the interlayer dielectric layer 126 are then etched to form contact openings 128 that expose (and, in some embodiments, partially remove) a portion of initial gate structures 122' and form the final gate structures 122".

Embodiments according to FIG. 6A include operation 622*a* during which the contact openings 128 are filled with one or more conductive materials for providing electrical contact between the final gate structure 122" and subsequent metal layers (not shown) that are subsequently formed on the interlayer dielectric pattern 126'.

Embodiments according to FIG. 6A include optional operation 624*a* in some embodiments during which all subsequent processing operations are conducted, the semiconductor device is tested, packaged, and, in some embodiments, retested, to obtain a completed semiconductor integrated circuit device for distribution to customers.

Figure 6B:
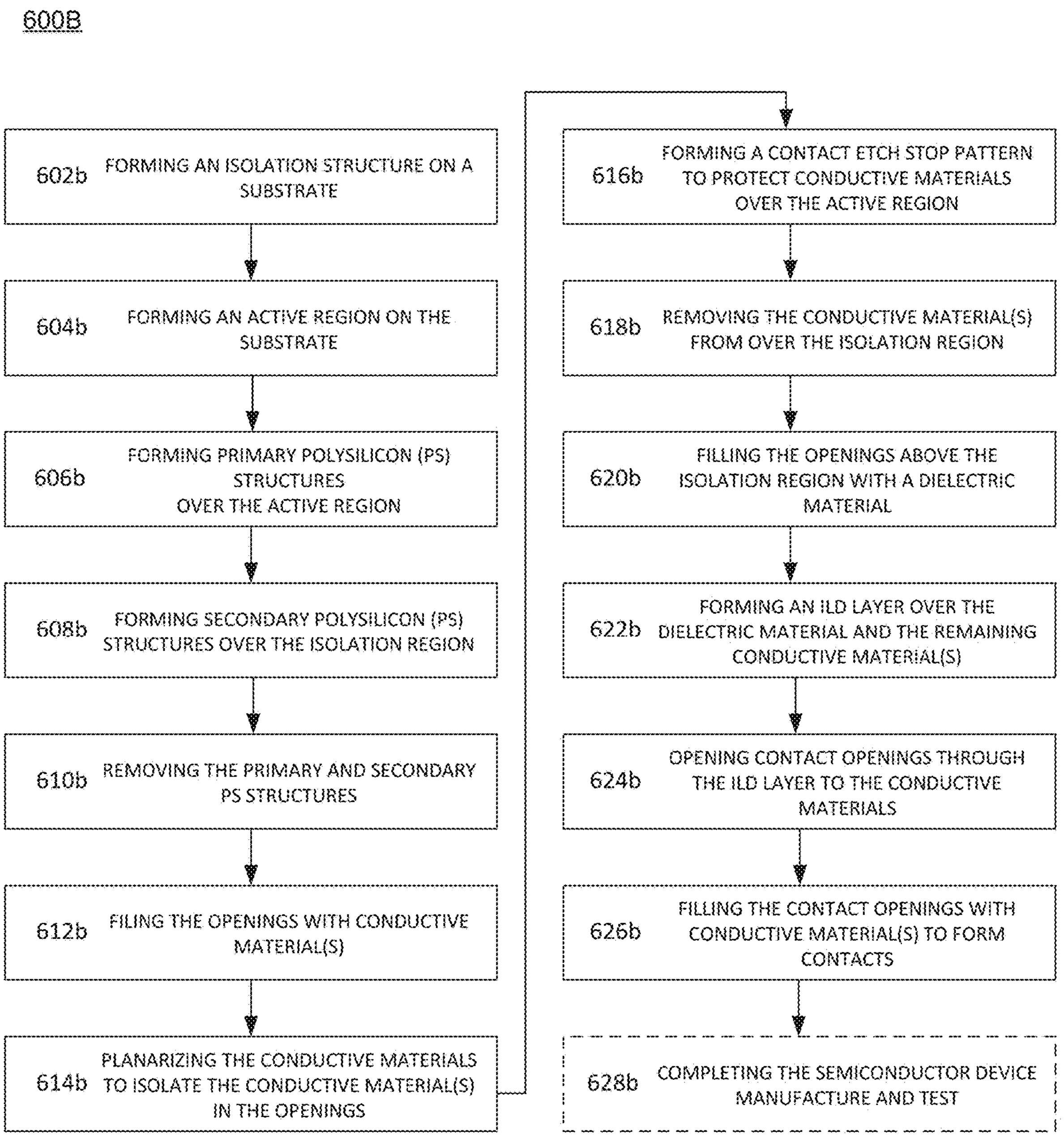

FIG. 6B is a flowchart of a manufacturing process 600B for the production of IC semiconductor devices according to some embodiments. In some embodiments, manufacturing process 600B is used to manufacture an IC device according to FIGS. 3A-3N and references to the structures identified above in connection with FIGS. 3A-3N are incorporated below to aid in the understanding the flowchart of FIG. 6B and not by way of limiting the application of manufacturing process 600B.

Embodiments according to FIG. 6B include operation 602*b* during which the substrate, e.g., a semiconductor substrate 101, is prepared and certain FEOL operations are completed to manufacture, for example, isolation structure 104, e.g., shallow trench isolation (STI) structures. In some embodiments the final layer or layers of material applied to the surface of the substrate is/are planarized using an etch-back and/or CMP process to remove upper portions of at least some of the material layers present on the semiconductor substrate 101 to prepare the surface for subsequent processing.

Embodiments according to FIG. 6B include operation 604*b* during which the substrate, e.g., a semiconductor substrate 101, is prepared and certain FEOL operations are completed to manufacture, for example, active regions 102, over which certain functional elements are subsequently formed to provide the desired functionality and performance of the resulting semiconductor device. In some embodiments the order of the operations 602*b* and 604*b* are reversed.

Embodiments according to FIG. 6B include operation 606*b* during which primary polysilicon structures 106 are formed over the active regions 102 of the substrate in order to establish the spacing and the dimensions of a functional element that will subsequently replace the primary polysilicon structures.

Embodiments according to FIG. 6B include operation 608*b* during which secondary polysilicon structures 110 are formed over the isolation structure(s) 104 of the substrate in order to establish, at least in part, the spacing and the dimensions of a functional element that will subsequently replace the secondary polysilicon structures. In some embodiments the order of the operations 606*a* and 608*a* are reversed while in other embodiments of the operations 606*a* and 608*a* are performed simultaneously.

Embodiments according to FIG. 6B include operation 610*b* during which both the primary polysilicon structures 106 and the secondary polysilicon structures 110 are removed using one or more wet and/or dry etching processes.

Embodiments according to FIG. 6B include operation 612*b* during which each of the openings is filled with a conductive composite structure 122, e.g., a gate electrode structure.

Embodiments according to FIG. 6B include operation 614*b* during which the conductive layers deposited on the device surface are subjected to a planarization operation to remove the upper portion of the conductive materials and leave each of the openings filled with a laminar conductive structures 121', e.g., a gate electrode structure.

Embodiments according to FIG. 6B include operation 616*b* during which an etch stop pattern 116' is formed to protect the laminar conductive structures 121' formed over the active region 102.

Embodiments according to FIG. 6B include operation 618*b* during which the exposed laminar conductive structures 121' formed over the isolation structure 104 are removed to form openings 138.

Embodiments according to FIG. 6B include operation 620*b* during which the openings 138 are filled with a dielectric material 142.

Embodiments according to FIG. 6B include operation 622*b* during which an interlayer dielectric 144 layer is formed for separating and insulating the conductive structures from higher level metallization (not shown).

Embodiments according to FIG. 6B include optional operation 624*b* in some embodiments during which a contact pattern is formed on the interlayer dielectric 144 layer. The exposed portions of the interlayer dielectric 144 layer are then etched to form contact openings 128 that expose (and, in some embodiments, partially remove) a portion of initial gate structures 122'.

Embodiments according to FIG. 6B include operation 626*b* during which the contact openings 128 are filled with one or more conductive materials for providing electrical contact between the final gate structure 122" and subsequent metal layers (not shown) that are subsequently formed on the interlayer dielectric pattern 144'.

Embodiments according to FIG. 6B include optional operation 628*b* in some embodiments during which all subsequent processing operations are conducted, the semiconductor device is tested, packaged, and, in some embodiments, retested, to obtain a completed semiconductor integrated circuit device for distribution to customers.

Figure 6C:
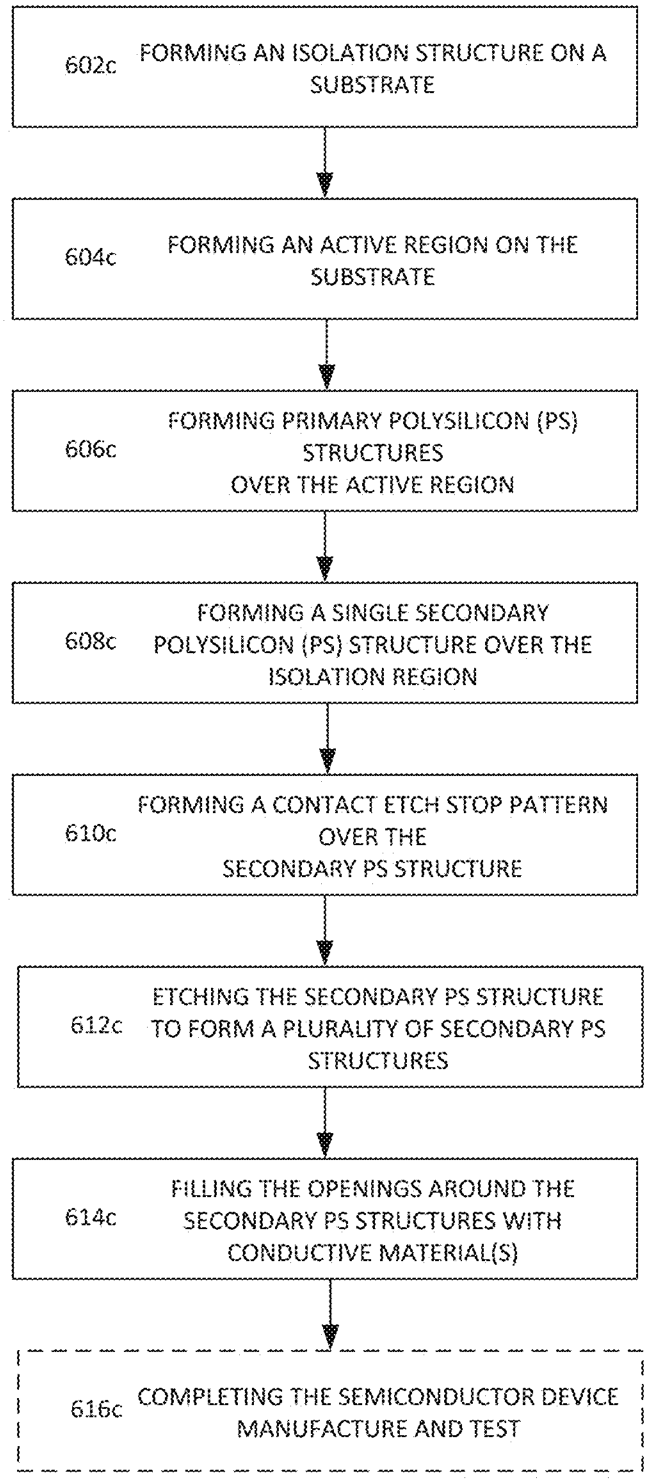

FIG. 6C is a flowchart of a manufacturing process 600C for the production of IC semiconductor devices according to some embodiments. In some embodiments, manufacturing process 600C is used to manufacture an IC device according to FIGS. 4A-4F and references to the structures identified above in connection with FIGS. 4A-4F are incorporated below to aid in the understanding the flowchart of FIG. 6C and not by way of limiting the application of manufacturing process 600C.

Embodiments according to FIG. 6C include operation 602*c* during which the substrate, e.g., a semiconductor substrate 101, is prepared and certain FEOL operations are completed to manufacture, for example, isolation structure 104, e.g., shallow trench isolation (STI) structures. In some embodiments the final layer or layers of material applied to the surface of the substrate is/are planarized using an etch-back and/or CMP process to remove upper portions of at least some of the material layers present on the semiconductor substrate 101 to prepare the surface for subsequent processing.

Embodiments according to FIG. 6C include operation 604*c* during which the substrate, e.g., a semiconductor substrate 101, is prepared and certain FEOL operations are completed to manufacture, for example, active regions 102, over which certain functional elements are subsequently formed to provide the desired functionality and performance of the resulting semiconductor device. In some embodiments the order of the operations 602*c* and 604*c* are reversed.

Embodiments according to FIG. 6C include operation 606*c* during which primary polysilicon structures 106 are formed over the active regions 102 of the substrate in order to establish the spacing and the dimensions of a functional element that will subsequently replace the primary polysilicon structures.

Embodiments according to FIG. 6C include operation 608*c* during which a single secondary polysilicon structure 110 are formed over the isolation structure(s) 104 of the substrate in order to establish, at least in part, the spacing and the dimensions of a functional element that will subsequently replace the secondary polysilicon structure. In some embodiments the order of the operations 606*c* and 608*c* are reversed while in other embodiments, the operations of the operations 606*c* and 608*c* are performed simultaneously.

Embodiments according to FIG. 6C include operation 610*c* during which an etch stop pattern 116' is formed to protect the portions of single secondary polysilicon structure 110 formed over the isolation structure 104.

Embodiments according to FIG. 6C include operation 612*c* during which the secondary polysilicon structure 110 is etched to form a plurality of secondary polysilicon structures 110' surrounded by secondary openings 111.

Embodiments according to FIG. 6C include operation 614*c* during which the secondary openings 111 are filled with a conductive material 113.

Embodiments according to FIG. 6C include optional operation 616*c* in some embodiments during which all subsequent processing operations are conducted, the semiconductor device is tested, packaged, and, in some embodiments, retested, to obtain a completed semiconductor integrated circuit device for distribution to customers.

Figure 6D:
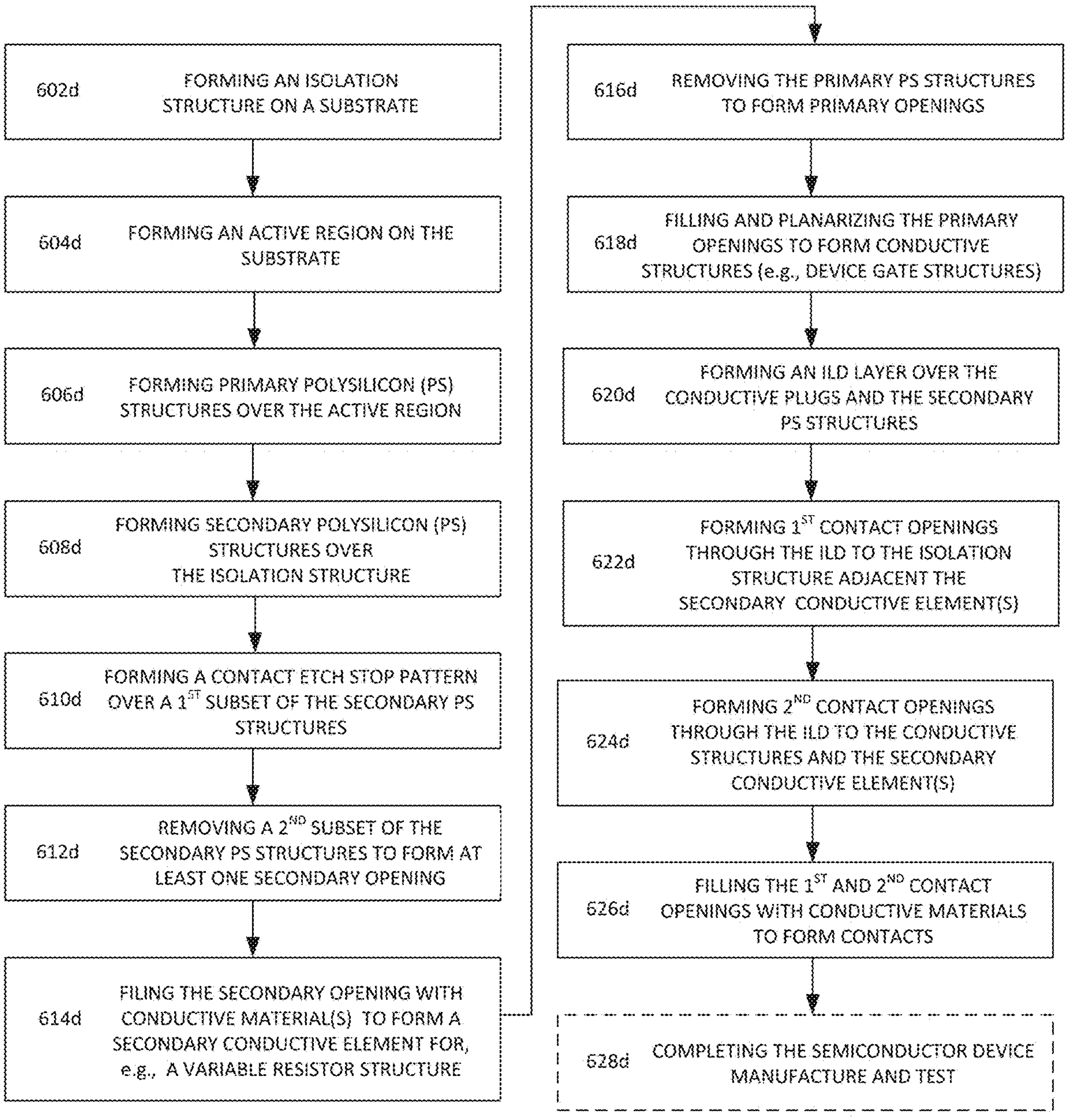

FIG. 6D is a flowchart of a manufacturing process 600D for the production of IC semiconductor devices according to some embodiments. In some embodiments, manufacturing process 600D is used to manufacture an IC device according to FIGS. 5A-5L and references to the structures identified above in connection with FIGS. 5A-5L are incorporated below to aid in the understanding the flowchart of FIG. 6D and not by way of limiting the application of manufacturing process 600D.

Embodiments according to FIG. 6D include operation 602*d* during which the substrate, e.g., a semiconductor substrate 101, is prepared and certain FEOL operations are completed to manufacture, for example, isolation structure 104, e.g., shallow trench isolation (STI) structures. In some embodiments the final layer or layers of material applied to the surface of the substrate is/are planarized using an etch-back and/or CMP process to remove upper portions of at least some of the material layers present on the semiconductor substrate 101 to prepare the surface for subsequent processing.

Embodiments according to FIG. 6D include operation 604*d* during which the substrate, e.g., a semiconductor substrate 101, is prepared and certain FEOL operations are completed to manufacture, for example, active regions 102, over which certain functional elements are subsequently formed to provide the desired functionality and performance of the resulting semiconductor device. In some embodiments the order of the operations 602*d* and 604*d* are reversed.

Embodiments according to FIG. 6D include operation 606*d* during which primary polysilicon structures 106 are formed over the active regions 102 of the substrate in order to establish the spacing and the dimensions of a functional element that will subsequently replace the primary polysilicon structures.

Embodiments according to FIG. 6D include operation 608*d* during which secondary polysilicon structures 110 are formed over the isolation structure(s) 104 of the substrate in order to establish, at least in part, the spacing and the dimensions of a functional element that will subsequently replace the secondary polysilicon structures. In some embodiments the order of the operations 606*d* and 608*d* are reversed while in other embodiments of the operations 606*d* and 608*d* are performed simultaneously.

Embodiments according to FIG. 6D include operation 610*d* during which an etch stop pattern 116' is formed to protect a subset of the secondary polysilicon structures 110 during a subsequent etch.

Embodiments according to FIG. 6D include operation 612*d* during which the exposed secondary polysilicon structures 110 are removed to form one or more openings.

Embodiments according to FIG. 6D include operation 614*d* during which each of the openings is filled with one or more conductive materials to form a conductive element 145.

Embodiments according to FIG. 6D include operation 616*d* during which the primary polysilicon structures 106 are removed to form primary contact openings 120.

Embodiments according to FIG. 6D include operation 618*d* during which the conductive materials 121 are deposited on the device surface to fill the primary contact openings 120 and then planarized to remove the upper portion of the conductive materials and leave each of the openings filled with a conductive composite structures 122, e.g., an initial gate electrode structure 121'.

Embodiments according to FIG. 6D include operation 620*d* during which an interlayer dielectric 144 layer is formed for separating and insulating the conductive structures from higher level metallization (not shown).

Embodiments according to FIG. 6D include optional operation 622*d* in some embodiments during which a contact pattern (not shown) is formed on the interlayer dielectric 144 layer. The exposed portions of the interlayer dielectric 144 layer are then etched to form a first set of openings 150 on opposite sides of the conductive element 145.

Embodiments according to FIG. 6D include optional operation 624*d* in some embodiments during which a second contact pattern (not shown) is formed on the interlayer dielectric pattern 144' formed by the first contact etch. The exposed portions of the interlayer dielectric pattern 144' layer are then etched to form a second set of contact openings 128.

Embodiments according to FIG. 6D include operation 626*d* during which the first and second contact openings 150, 128 are filled with one or more conductive materials for providing electrical contact between the final gate structure 122", the conductive element 145, and secondary polysilicon structures 110A, 110B that are adjacent the conductive element 145 and subsequent metal layers (not shown) that are subsequently formed on the interlayer dielectric pattern 144".

Embodiments according to FIG. 6D include optional operation 628*d* in some embodiments during which all subsequent processing operations are conducted, the semiconductor device is tested, packaged, and, in some embodiments, retested, to obtain a completed semiconductor integrated circuit device for distribution to customers.

Figure 6E:
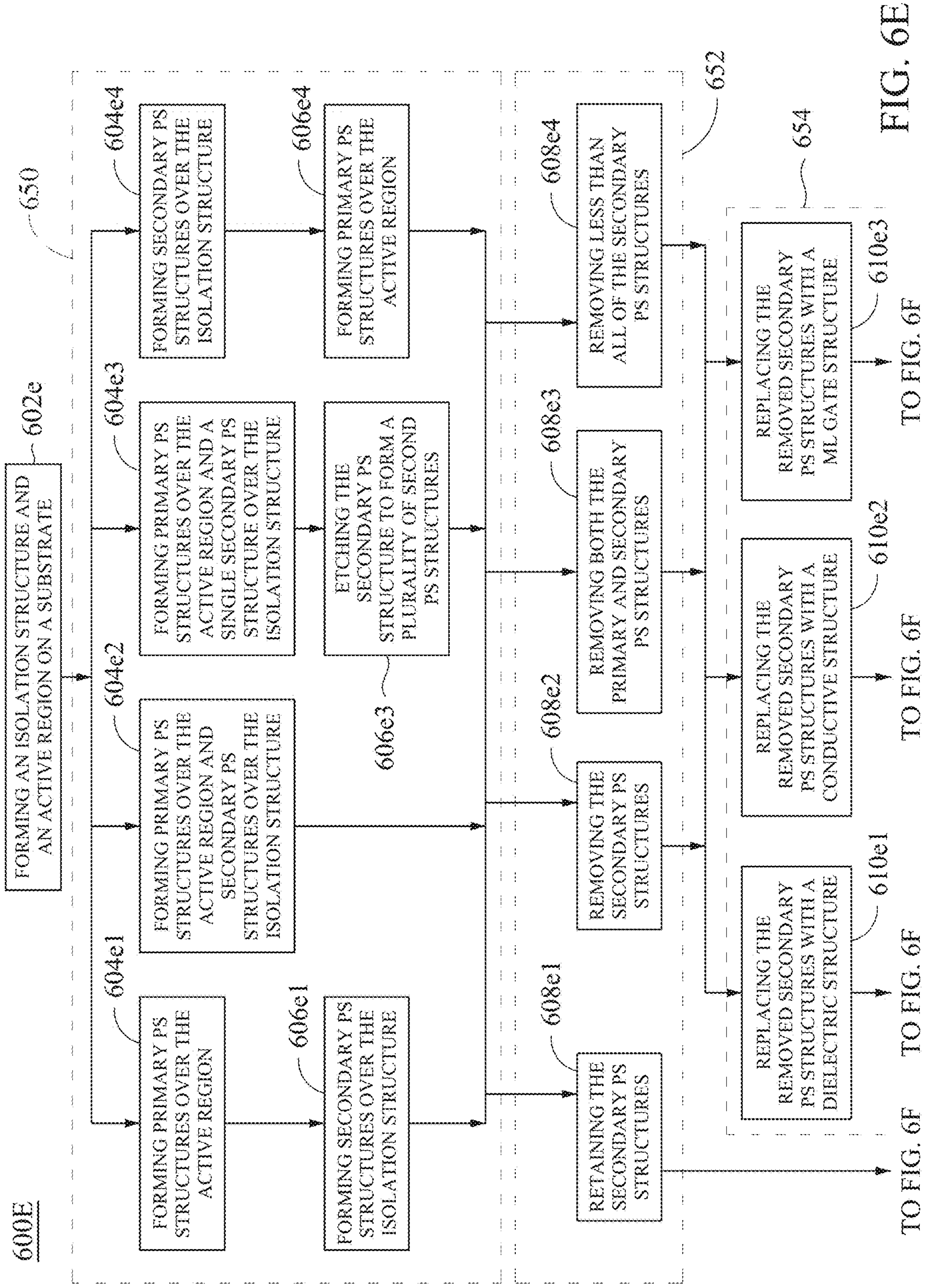
Figure 6F:
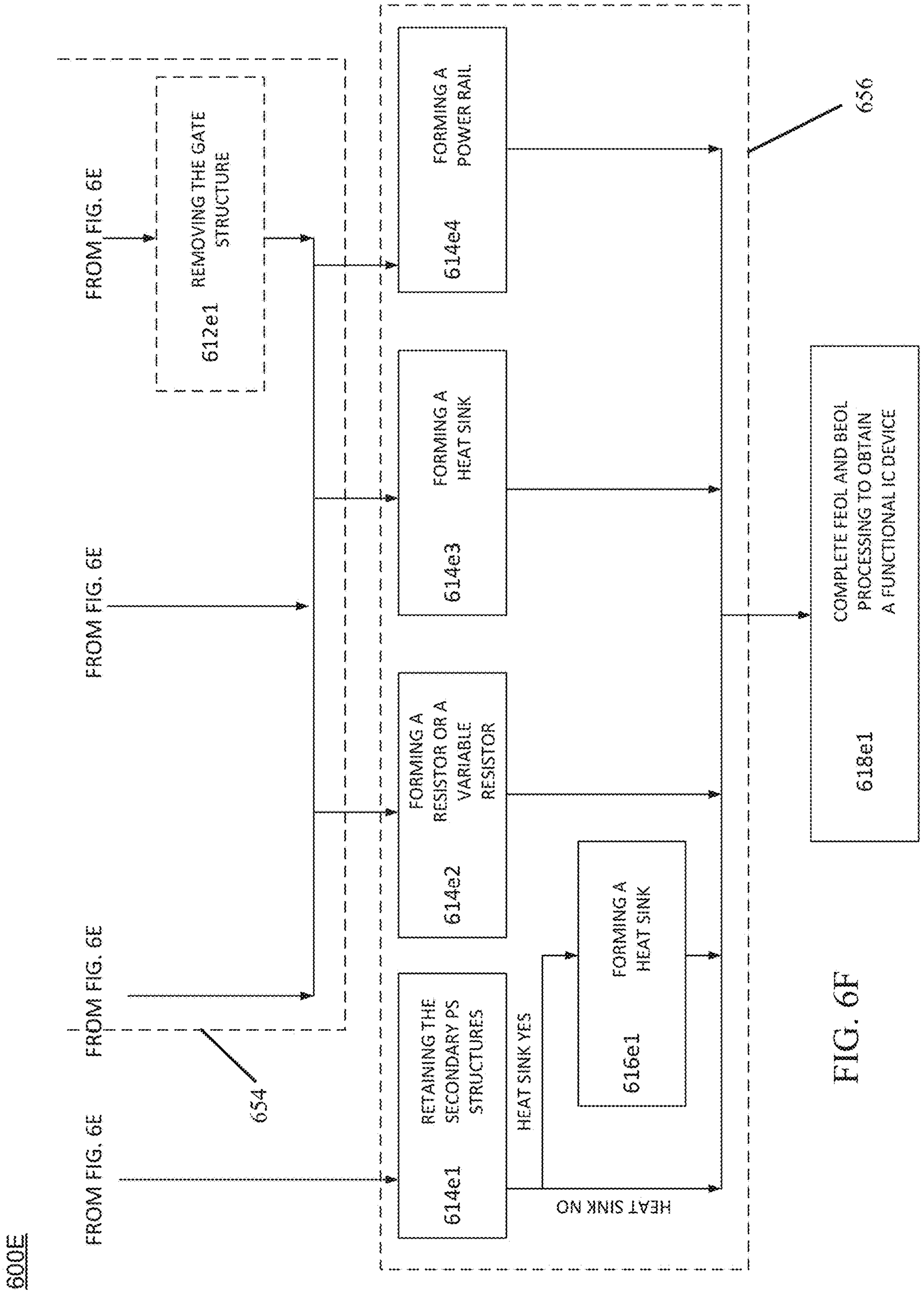

As reflected in the discussion above, the manner and sequence in which the primary and secondary polysilicon structures are formed, removed, replaced, and/or maintained can be adapted for a number of embodiments of methods for manufacturing semiconductor devices. Further, the operations at each stage of the process are, at least to some degree, independent of the preceding operations. FIGS. 6E and 6F flowchart of various embodiments of a manufacturing processes 600E for manufacturing IC devices utilizing secondary polysilicon structures 110, 110' that are positioned over one or more isolation structures 104.

As reflected in FIG. 6E, the initial operation 602*e* involves forming an isolation structure 104 and an active region 102, typically on a semiconductor substrate 101. A The next step in the manufacturing process involves the formation of primary polysilicon structures 106 and secondary polysilicon structures 110, 110' according to any of the operations 604*e*1/606*e*1, 604*e*2. 604E3/606*e*3, or 606*e*4/606*e*4/608*e*3 depending on the operation selected from operation group 650.

Once the primary polysilicon structures 106 and secondary polysilicon structures 110, 110' are formed, the polysilicon structures are then maintained, operation 608*e*1, selectively removed, operations 608*e*2, 608*e*4, or completely removed, operation 608*e*3 depending on the operation selected from operation group 652.

In embodiments in which some or all of the primary polysilicon structures 106 and secondary polysilicon structures 110, 110' are removed, one or more openings are formed on the surface of the IC device. These openings are then filled with a dielectric material, operation 610*e*1, a conductive material/structure, operation 610*e*2, or a metal or metal gate structure, operation 610*e*3. In some embodiments, the metal/metal gate material is subsequently removed to form secondary openings, operation 612*e*1, being removed either selectively or completely according to any of the operations in operation group 654 (bridging FIGS. 6E and 6F).

As reflected in the continuation of manufacturing processes 600E in FIG. 6F, in some embodiments, once openings have been formed on the surface of the IC device, the openings are then filled with one or more materials to form functional elements positioned over the isolation structure 104 and thereby increase device density without adding to the device height. In some embodiments, the openings formed by removing (or maintaining) the secondary polysilicon structures 110, 110' are maintained, operation 614*e*1, converted to form resistors or controllable variable resistors, operation 614*e*2, a heat sink, operation 614*e*1/616*e*1, 614*e*3, and/or a power rail, operation 614*e*4 according to any of the operations in operation group 656.

In some embodiments, the manufacturing methods encompassed by conclude with an optional operation 618*e*1 in some embodiments during which all subsequent processing operations are conducted, the semiconductor device is tested, packaged, and, in some embodiments, retested, to obtain a completed semiconductor integrated circuit device for distribution to customers.

Figure 7:
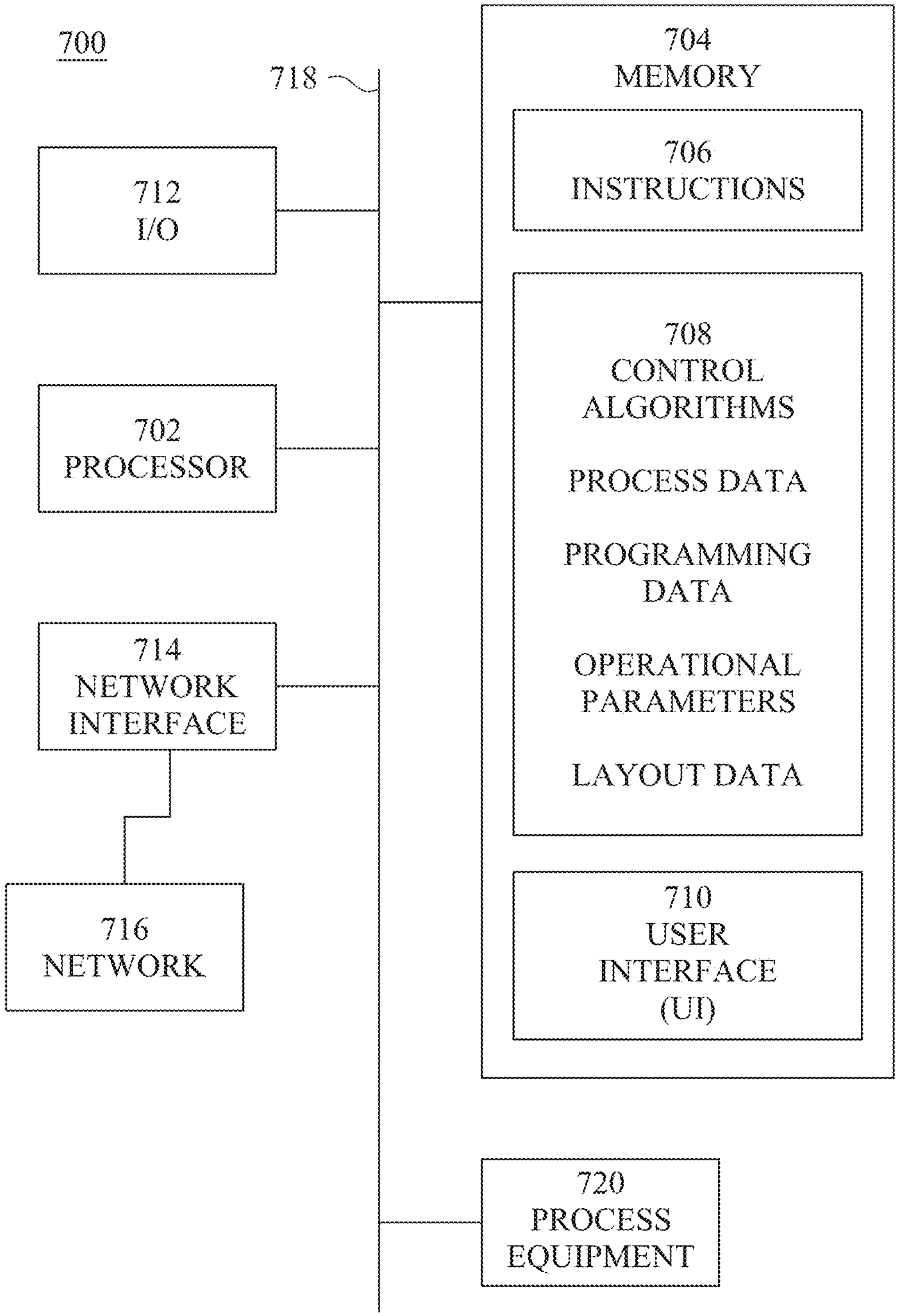
FIG. 7 is a schematic diagram of a system for manufacturing FET devices according to some embodiments.

FIG. 7 is a block diagram of an electronic process control system 700 (EPC System), in accordance with some embodiments. Methods used for generating cell layout diagrams corresponding to some embodiments of the FET device structures detailed above, particularly with respect to the addition and placement of the electrical contacts, thermal contacts, active metal patterns, dummy metal patterns, and other heat dissipating structures may be implemented, for example, using EPC system 700, in accordance with some embodiments of such systems.

In some embodiments, EPC system 700 is a general purpose computing device including a hardware processor 702 and a non-transitory, computer-readable storage medium 704. Computer-readable storage medium 704, amongst other things, is encoded with, i.e., stores, computer program code 706, i.e., a set of computer-executable instructions. Execution of computer program code 706 by hardware processor 702 represents (at least in part) an EPC tool which implements a portion or all of, e.g., the methods described herein in accordance with one or more (hereinafter, the noted processes and/or methods).

Hardware processor 702 is electrically coupled to computer-readable storage medium 704 via a bus 718. Hardware processor 702 is also electrically coupled to an I/O interface 712 by bus 718. A network interface 714 is also electrically connected to hardware processor 702 via bus 718. Network interface 714 is connected to a network 716, so that hardware processor 702 and computer-readable storage medium 704 are capable of connecting to external elements via network 716. Hardware processor 702 is configured to execute computer program code 706 encoded in computer-readable storage medium 704 in order to cause the EPC system 700 to be usable for performing a portion or all of the noted processes and/or methods. In one or more embodiments, hardware processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, computer-readable storage medium 704 stores computer program code 706 configured to cause the EPC system 700 (where such execution represents (at least in part) the EPC tool) to be usable for performing a portion or all of the noted processes and/or methods. In one or more embodiments, computer-readable storage medium 704 also stores information which facilitates performing a portion or all of the noted processes and/or methods. In one or more embodiments, computer-readable storage medium 704 stores process control data 708 including, in some embodiments, control algorithms, process variables and constants, target ranges, set points, programming control data, and code for enabling statistical process control (SPC) and/or model predictive control (MPC) based control of the various processes.

EPC system 700 includes I/O interface 712. I/O interface 712 is coupled to external circuitry. In one or more embodiments, I/O interface 712 includes a keyboard, keypad, mouse, trackball, trackpad, touchscreen, and/or cursor direction keys for communicating information and commands to hardware processor 702.

EPC system 700 also includes network interface 714 coupled to hardware processor 702. Network interface 714 allows EPC system 700 to communicate with network 716, to which one or more other computer systems are connected. Network interface 714 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 700.

EPC system 700 is configured to send information to and receive information from fabrication tools 720 that include one or more of ion implant tools, etching tools, deposition tools, coating tools, rinsing tools, cleaning tools, chemical-mechanical planarizing (CMP) tools, testing tools, inspection tools, transport system tools, and thermal processing tools that will perform a predetermined series of manufacturing operations to produce the desired integrated circuit devices. The information includes one or more of operational data, parametric data, test data, and functional data used for controlling, monitoring, and/or evaluating the execution, progress, and/or completion of the specific manufacturing process. The process tool information is stored in and/or retrieved from computer-readable storage medium 704.

EPC system 700 is configured to receive information through I/O interface 712. The information received through I/O interface 712 includes one or more of instructions, data, programming data, design rules that specify, e.g., layer thicknesses, spacing distances, structure and layer resistivity, and feature sizes, process performance histories, target ranges, set points, and/or other parameters for processing by hardware processor 702. The information is transferred to hardware processor 702 via bus 718. EPC system 700 is configured to receive information related to a user interface (UI) through I/O interface 712. The information is stored in computer-readable storage medium 704 as user interface (UI) 710.

In some embodiments, at least a portion of the noted processes and/or methods is implemented as a standalone software application for execution by a processor. In some embodiments, at least a portion of the noted processes and/or methods is implemented as a software application that is a part of an additional software application. In some embodiments, at least a portion of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 700.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
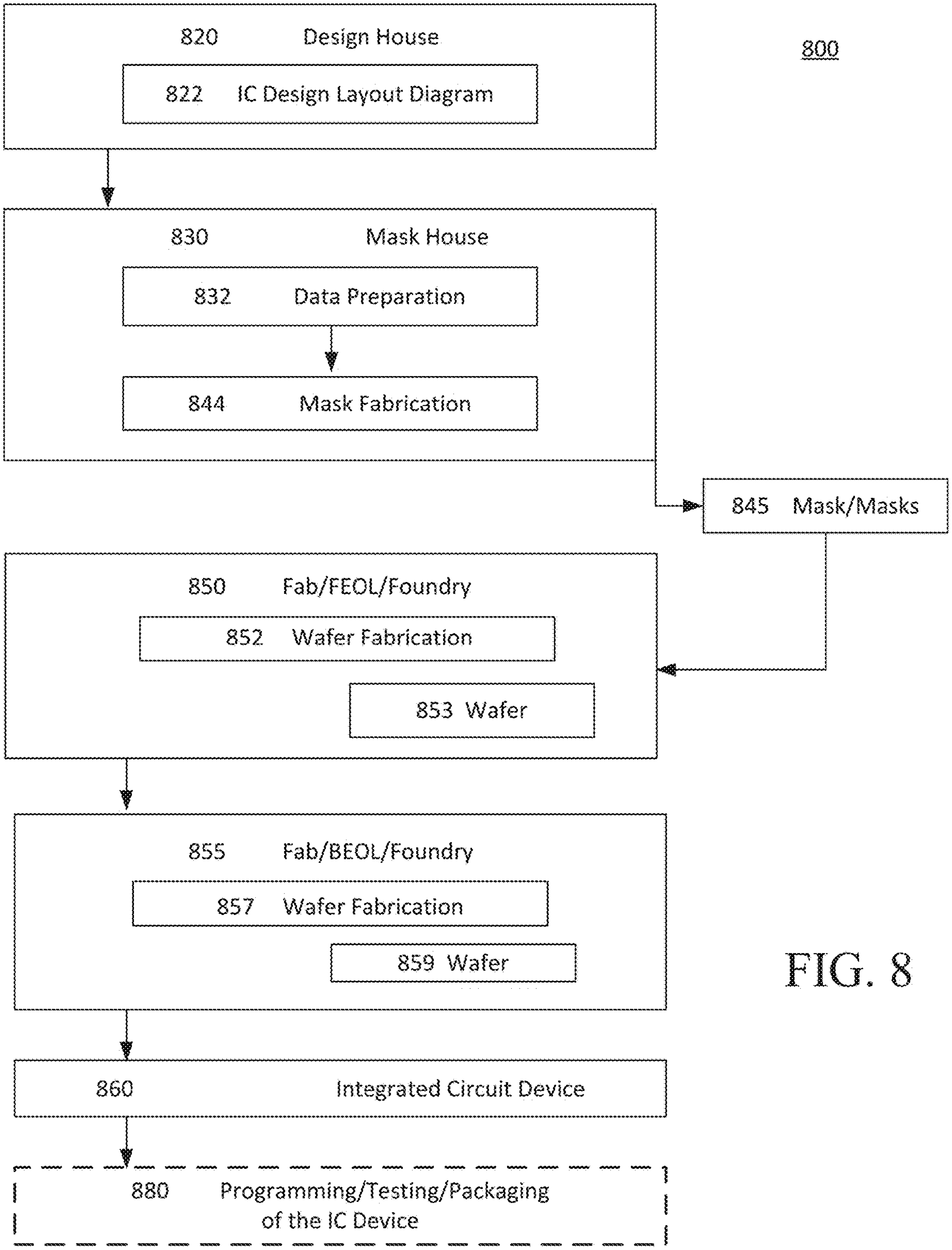
FIG. 8 is a flowchart of IC device design, manufacture, and programming of IC devices according to some embodiments.

FIG. 8 is a block diagram of an integrated circuit (IC) manufacturing system 800, and an IC manufacturing flow associated therewith, in accordance with some embodiments for manufacturing IC devices that incorporate the improved control over the SSD and EPI profile. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. Once the manufacturing process has been completed to form a plurality of IC devices on a wafer, the wafer is optionally sent to backend or back end of line (BEOL) 880 for, depending on the device, programming, electrical testing, and packaging in order to obtain the final IC device products. The entities in manufacturing system 800 are connected by a communications network. In some embodiments, the communications network is a single network. In some embodiments, the communications network is a variety of different networks, such as an intranet and the Internet.

The communications network includes wired and/or wireless communication channels. Each entity interacts with one or more of the other entities and provides services to and/or receives services from one or more of the other entities. In some embodiments, two or more of design house 820, mask house 830, and IC Fab 850 is owned by a single larger company. In some embodiments, two or more of design house 820, mask house 830, and IC Fab 850 coexist in a common facility and use common resources.

Design house 820 (or design team) generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features.

For example, a portion of IC design layout diagram 822 includes various IC features, such as an active region, gate electrode, source and drain, metal lines or vias of an inter-metal interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822, in some operations, will be expressed in a GDSII file format or DFII file format.

Whereas the pattern of a modified IC design layout diagram is adjusted by an appropriate method in order to, for example, reduce parasitic capacitance of the integrated circuit as compared to an unmodified IC design layout diagram, the modified IC design layout diagram reflects the results of changing positions of conductive line in the layout diagram, and, in some embodiments, inserting to the IC design layout diagram, features associated with capacitive isolation structures to further reduce parasitic capacitance, as compared to IC structures having the modified IC design layout diagram without features for forming capacitive isolation structures located therein.

Mask house 830 includes mask data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask 845 (or reticle) or a semiconductor wafer 853. The IC design layout diagram 822 is manipulated by mask data preparation 832 to comply with particular characteristics of the mask writer and/or requirements of IC Fab 850. In FIG. 8, mask data preparation 832 and mask fabrication 844 are illustrated as separate elements. In some embodiments, mask data preparation 832 and mask fabrication 844 are collectively referred to as mask data preparation.

In some embodiments, mask data preparation 832 includes optical proximity correction (OPC) which uses lithography enhancement techniques to compensate for image errors, such as those that are known to arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC Fab 850 to fabricate IC device 860. LPC simulates this processing based on IC design layout diagram 822 to create a simulated manufactured device, such as IC device 860. In some embodiments, the processing parameters in LPC simulation will include parameters associated with various processes of the IC manufacturing cycle, parameters associated with tools used for manufacturing the IC, and/or other aspects of the manufacturing process. LPC accounts for various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are repeated to further refine IC design layout diagram 822.

It should be understood that the above description of mask data preparation 832 has been simplified for the purposes of clarity. In some embodiments, mask data preparation 832 includes additional features such as a logic operation (LOP) to modify the IC design layout diagram 822 according to manufacturing rules. Additionally, the processes applied to IC design layout diagram 822 during mask data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask 845 (aka photomask or reticle) based on the modified IC design layout diagram 822. Mask 845 will be formed using a process selected from various available technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask.

In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask will be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC Fab 850 includes wafer fabrication 852. IC Fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

Wafer fabrication 852 includes forming a patterned layer of mask material formed on a semiconductor substrate is made of a mask material that includes one or more layers of photoresist, polyimide, silicon oxide, silicon nitride (e.g., $Si_3N_4$, SION, SiC, SiOC), or combinations thereof. In some embodiments, masks 845 include a single layer of mask material. In some embodiments, a mask 845 includes multiple layers of mask materials.

In some embodiments IC Fab 855 includes wafer fabrication 857. IC Fab 855 is an IC fabrication business that includes one or more manufacturing facilities for the fabrication of a variety of different IC products. In some embodiments, IC Fab 855 is a manufacturing facility provide the back end fabrication for the interconnection and packaging of the IC products (back-end-of-line (BEOL) fabrication) to add one or more metallization layers to wafer 859, and a third manufacturing facility (not shown) may provide other services for the foundry business such as packaging and labelling.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

In some embodiments, etching processes include presenting the exposed structures in the functional area(s) to an oxygen-containing atmosphere to oxidize an outer portion of the exposed structures, followed by a chemical trimming process such as plasma-etching or liquid chemical etching, as described above, to remove the oxidized material and leave behind a modified structure. In some embodiments, oxidation followed by chemical trimming is performed to provide greater dimensional selectivity to the exposed material and to reduce a likelihood of accidental material removal during a manufacturing process. In some embodiments, the exposed structures may include the fin structures of Fin Field Effect Transistors (FinFET) with the fins being embedded in a dielectric support medium covering the sides of the fins. In some embodiments, the exposed portions of the fins of the functional area are top surfaces and sides of the fins that are above a top surface of the dielectric support medium, where the top surface of the dielectric support medium has been recessed to a level below the top surface of the fins, but still covering a lower portion of the sides of the fins.

Subsequent to mask patterning operations, areas not covered by the mask are etched to modify a dimension of one or more structures within the exposed area(s). In some embodiments, the etching is performed using plasma etching, reactive ion etching (RIE), or a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof.

In some embodiments, the etching process is a dry-etch or plasma etch process. Plasma etching of a substrate material is performed using halogen-containing reactive gasses excited by an electromagnetic field to dissociate into ions. Reactive or etchant gases include, for example, $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed material by alternating electromagnetic fields or by fixed bias according to methods of plasma etching that are known in the art.

In some embodiments, molecular level processing technologies that share the self-limiting surface reaction characteristics utilized in ALD including, for example, Molecular Layer Deposition (MLD) and Self-Assembled Monolayers (SAM). MLD utilizes successive precursor-surface reactions in which a precursor is introduced into a reaction zone above the wafer surface. The precursor adsorbs to the wafer surface where it is confined by physisorption. The precursor then undergoes a quick chemisorption reaction with a number of active surface sites, leading to the self-limiting formation of molecular attachments in specific assemblies or regularly recurring structures. These MLD structures will be formed successfully using lower process temperatures than some traditional deposition techniques.

SAM is a deposition technique that involves the spontaneous adherence of organized organic structures on a wafer surface. This adherence involves adsorption of the organic structures from the vapor or liquid phase utilizing relatively weak interactions with the wafer surface. Initially, the structures are adsorbed on the surface by physisorption through, for instance, van der Waals forces or polar interactions. The self-assembled monolayers will then become confined to the surface by a chemisorption process. In some embodiments, the ability of SAM to grow layers as thin as a single molecule through chemisorption-driven interactions with the wafer surface(s) will be particularly useful in forming thin films including, for example, "near-zero-thickness" activation or barrier layers. SAM will also be particularly useful in area-selective deposition (ASD) (or area-specific deposition) using molecules that exhibit preferential reactions with specific segments of the underlying wafer surface in order to facilitate or obstruct subsequent material growth in the targeted areas. In some embodiments, SAM is used to form a foundation or blueprint region for subsequent area-selective ALD (AS-ALD) or area-selective CVD (AS-CVD).

The ALD, MLD, and SAM processes represent viable options for manufacturing thin layers (in some embodiments, the manufactured layers are only few atoms thick) that exhibit sufficient uniformity, conformality, and/or purity for the intended IC device application. By delivering the constituents of the material systems being manufactured both individually and sequentially into the processing environment, these processes and the precise control of the resulting surface chemical reactions allow for excellent control of processing parameters and the target composition and performance of the resulting film(s).

Figure 9:
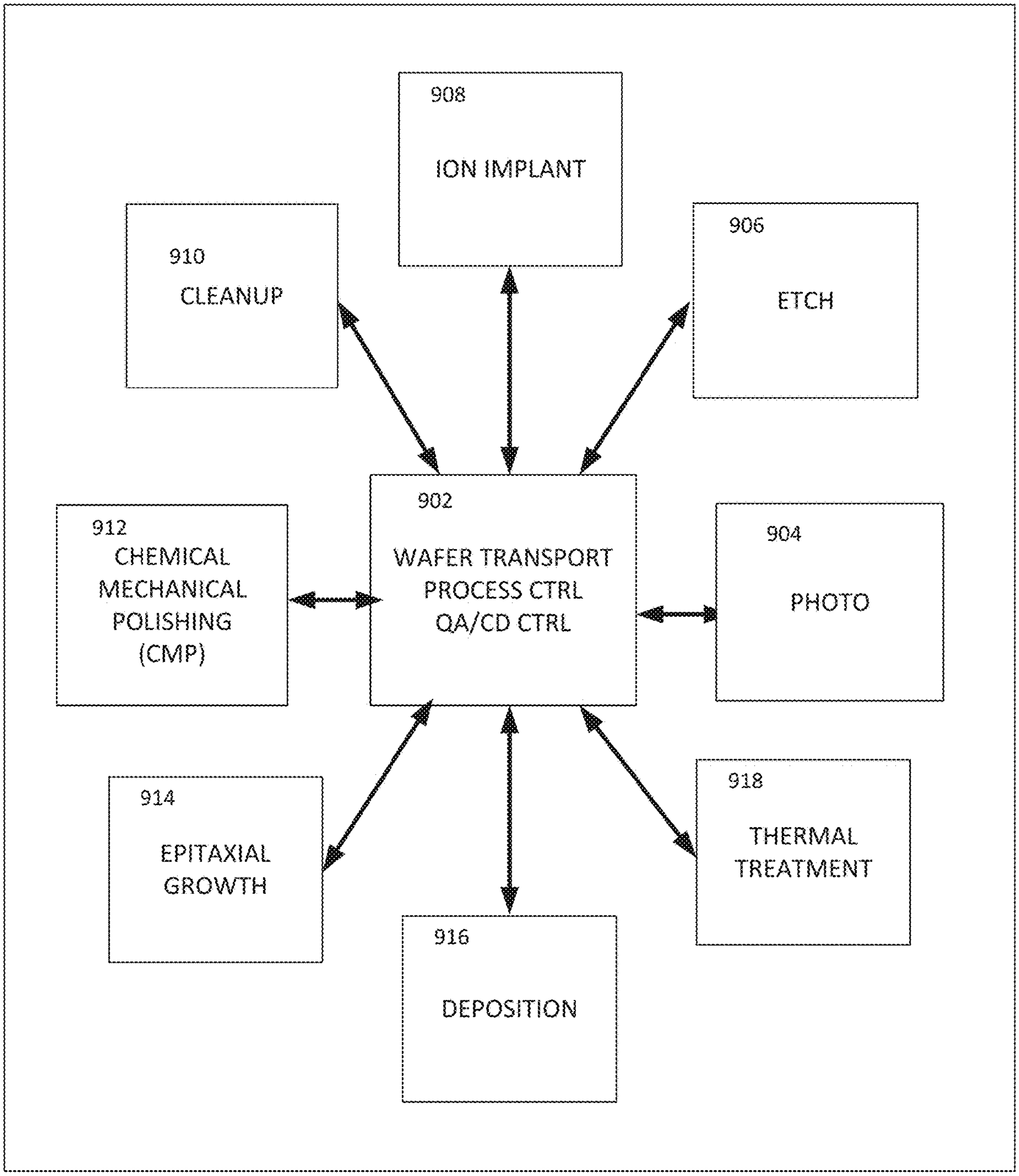
FIG. 9 is a schematic diagram of a processing system for manufacturing of IC devices according to some embodiments.

FIG. 9 is a schematic diagram of various processing departments defined within a Fab/Front End/Foundry for manufacturing IC devices according to some embodiments. The processing departments utilized in both front end of line (FEOL) and back end of line (BEOL) IC device manufacturing typically include a wafer transport operation 902 for moving the wafers between the various processing departments. In some embodiments, the wafer transport operation will be integrated with an electronic process control (EPC) system according to FIG. 7 and utilized for providing process control operations, ensuring that the wafers being both processed in a timely manner and sequentially delivered to the appropriate processing departments as determined by the process flow. In some embodiments, the EPC system will also provide control and/or quality assurance and parametric data for the proper operation of the defined processing equipment. Interconnected by the wafer transport operation 902 will be the various processing departments providing, for example, photolithographic operations 904, etch operations 906, ion implant operations 908, clean-up/strip operations 910, chemical mechanical polishing (CMP) operations 912, epitaxial growth operations 914, deposition operations 916, and thermal treatments 918.

In some embodiments, a method of manufacturing a semiconductor device includes the operations of forming an isolation structure in a substrate, forming a first active region on a first side of the isolation structure, forming a first plurality of primary polysilicon structures over the first active region, the primary polysilicon structures having a first contacted polysilicon pitch (CPP), and forming a secondary polysilicon structure over the isolation structure.

In some additional embodiments, the method of manufacturing a semiconductor device includes one or more additional operations including, for example, the operations of forming the secondary polysilicon structure includes forming a second plurality of secondary polysilicon structures that have a second contacted polysilicon pitch; spacing the second plurality of secondary polysilicon structures so that the first contacted polysilicon pitch and the second contacted polysilicon pitch are different; spacing the second plurality of secondary polysilicon structures so that the first contacted polysilicon pitch and the second contacted polysilicon pitch are equal; removing one of the second plurality of secondary polysilicon structures to form an opening and filing the opening with a conductive material; removing one of the second plurality of secondary polysilicon structures to form an opening and filing the opening with a polysilicon/silicon oxide/metal laminar structure; removing the second plurality of secondary polysilicon structures to form a plurality of openings and filing the plurality of openings with an insulating material; removing one of the second plurality of secondary polysilicon structures to form an opening so that the opening is positioned between and adjacent two of the remaining second plurality of secondary polysilicon structures, filling the opening with a conductive material, and establishing electrical contact to the conductive material in the opening and the two secondary polysilicon structures adjacent the filled opening; patterning and etching the secondary polysilicon structure to form the second plurality of secondary polysilicon structures; and/or removing the first plurality of primary polysilicon structures to form a plurality of primary openings, removing the second plurality of secondary polysilicon structures to form a plurality of secondary openings, and filling the plurality of primary openings and the plurality of secondary openings with a conductive structure.

In some embodiments, a method of manufacturing a semiconductor device includes the operations of forming an isolation structure in a substrate, forming a first active region on a first side of the isolation structure, forming a first plurality of primary polysilicon structures over the first active region, forming a second plurality of secondary polysilicon structures over the isolation structure, removing the first plurality of primary polysilicon structures to form a first plurality of openings, removing the second plurality of secondary polysilicon structures to form a second plurality of openings, filling the first plurality of openings and the second plurality of openings with a conductive material, removing the conductive material from the second plurality of openings to form a third plurality of openings, and filling the third plurality of openings with a dielectric material.

In some additional embodiments, the method of manufacturing a semiconductor device includes one or more additional operations including, for example, the operations of forming a barrier layer on an exposed surface of the third plurality of openings before filling the third plurality of openings with the dielectric material; forming a first plurality of contacts to the conductive material in the first plurality of openings; and/or forming a conductive structure that includes a plurality of different conductive materials.

In some embodiments, a semiconductor device includes features including a substrate, an isolation structure in the substrate, a first active region on a first side of the isolation structure, a first plurality of conductors formed over the first active region, a second active region on a second side of the isolation structure opposite the first active region, a second plurality of conductors formed over the second active region, and a secondary structure formed over the isolation structure with the secondary structure being between the first plurality of conductors and the second plurality of conductors.

In some additional embodiments, the semiconductor device includes one or more additional features including, for example, a conductor structure, a first polysilicon structure on a first side of the conductor structure, a second polysilicon structure on a second side of the conductor structure, a dielectric layer over the conductor structure and the first and second polysilicon structures, and contacts extending through the dielectric layer and providing direct electrical contact to the conductor structure and the first and second polysilicon structures; a first plurality of polysilicon structures; a first plurality of dielectric structures; a conductor structure, the conductor structure having a first conductive material forming barrier film on a dielectric surface and a second conductive material contained within a recess defined by the first conductive material and/or a secondary structure configured to provide a functional structure arranged between the first and second pluralities of conductors with the functional structure including at least one of a resistor, a power supply, a heat sink, and/or a variable resistor.

Semiconductor devices manufactured in accord with an embodiment of the methods detailed above each include at least one functional element that is both arranged above one or more isolation structures 104 and positioned at the same level of the vertical device structure comprising, for example, device gate structures and/or contact metal structures comprising conductive composite structures 122, to provide additional functionality without increasing the height of the device or reducing device density. In some embodiments in which the functional element is a power rail 221, most, if not all of the power rail 221 the conductive material(s) comprise one or more of W, Mo, Co, Nb, Al, Cu, Au, Ag, Ca, Zn, or Ir as well as mixtures and alloys thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

We claim:

1. A method of manufacturing a semiconductor device, comprising:
- forming an isolation structure in a substrate;
- forming a first active region on a first side of the isolation structure;
- forming a first plurality of primary polysilicon structures over the first active region, the primary polysilicon structures each having a first contacted polysilicon pitch (CPP); and
- forming a secondary polysilicon structure over the isolation structure, the secondary polysilicon structure being parallel to the primary polysilicon structures, and electrically separated from the first active region.

2. The method according to claim 1, wherein
- forming the secondary polysilicon structure further comprises forming a second plurality of secondary polysilicon structures, wherein the second plurality of secondary polysilicon structures have a second contacted polysilicon pitch.

3. The method according to claim 2, wherein
- forming the second plurality of secondary polysilicon structures further comprises spacing the second plurality of secondary polysilicon structures whereby the first contacted polysilicon pitch and the second contacted polysilicon pitch are different.

4. The method according to claim 2, wherein
- forming the second plurality of secondary polysilicon structures further comprises spacing the second plurality of secondary polysilicon structures whereby the first contacted polysilicon pitch and the second contacted polysilicon pitch are equal.

5. The method according to claim 2, further comprising:
removing one of the second plurality of secondary polysilicon structures to form an opening; and
filling the opening with a conductive material.

6. The method according to claim 2, further comprising:
removing one of the second plurality of secondary polysilicon structures to form an opening; and
filling the opening with a polysilicon/silicon oxide/metal laminar structure.

7. The method according to claim 2, further comprising:
removing the second plurality of secondary polysilicon structures to form a third plurality of openings; and
filling the third plurality of openings with an insulating material.

8. The method according to claim 2, further comprising:
removing a first secondary polysilicon structure to form an opening, wherein the opening is formed between a second secondary polysilicon structure and a third secondary polysilicon structure, the second and third secondary polysilicon structures being adjacent the opening;
filling the opening with a conductive material; and
establishing an electrical contact to the conductive material and the second and third secondary polysilicon structures.

9. The method according to claim 2, wherein:
forming the second plurality of secondary polysilicon structures further comprises patterning and etching the secondary polysilicon structure to form the second plurality of secondary polysilicon structures.

10. The method according to claim 2, further comprising:
removing the first plurality of primary polysilicon structures to form a plurality of primary openings;
removing the second plurality of secondary polysilicon structures to form a plurality of secondary openings; and
filling the plurality of primary openings and the plurality of secondary openings with a conductive structure.

11. A method of manufacturing a semiconductor device, comprising:
forming an isolation structure in a substrate;
forming a first active region on a first side of the isolation structure;
forming a first plurality of primary polysilicon structures over the first active region;
forming a second plurality of secondary polysilicon structures over the isolation structure;
removing the first plurality of primary polysilicon structures to form a first plurality of openings;
removing the second plurality of secondary polysilicon structures to form a second plurality of openings;
filling the first plurality of openings and the second plurality of openings with a conductive material;
removing the conductive material from the second plurality of openings to form a third plurality of openings; and
filling the third plurality of openings with a dielectric material.

12. The method according to claim 11, further comprising:
forming a barrier layer on an exposed surface of the third plurality of openings before filling the third plurality of openings with the dielectric material.

13. The method according to claim 11, further comprising:
forming a first plurality of contacts to the conductive material in the first plurality of openings.

14. The method according to claim 11, wherein filling the first plurality of openings and the second plurality of openings with a conductive material further comprises:
forming a conductive structure including a plurality of different conductive materials.

15. A method of manufacturing a semiconductor device, comprising:
forming an isolation structure in a substrate;
forming an active region in the substrate;
forming a first plurality of polysilicon structures over the active region;
forming a second plurality of polysilicon structures over the isolation structure, wherein the isolation structure is between an entirety of the second plurality of polysilicon structures and the active region;
removing each of the first plurality of polysilicon structures to form a first plurality of openings, wherein at least one of the first plurality of openings exposes the active region; and
forming a plurality of gate structures, wherein each gate structure of the plurality of gate structures is in a corresponding opening of the first plurality of openings.

16. The method of claim 15, further comprising maintaining the second plurality of polysilicon structures during removing of the first plurality of polysilicon structures.

17. The method of claim 15, further comprising removing the second plurality of polysilicon structures to form a plurality of second openings, wherein at least one of the plurality of second openings exposes the isolation structure.

18. The method of claim 17, wherein removing the second plurality of polysilicon structures is performed simultaneously with removing the first plurality of polysilicon structures.

19. The method of claim 17, further comprising filling each of the plurality of second openings with a dielectric material.

20. The method of claim 15, further comprising:
forming a dielectric layer over the plurality of gate structures and the second plurality of polysilicon structures; and
forming a plurality of contacts extending through the dielectric layer, wherein each contact of the plurality of contacts is electrically connected to a corresponding gate structure of the plurality of gate structures.

* * * * *